US010063816B2

(12) United States Patent
Yorikado

(10) Patent No.: US 10,063,816 B2
(45) Date of Patent: Aug. 28, 2018

(54) SOLID STATE IMAGING DEVICE, ELECTRONIC APPARATUS, AND METHOD FOR MANUFACTURING SOLID STATE IMAGING DEVICE

(71) Applicant: SONY CORPORATION, Tokyo (JP)

(72) Inventor: Yuhi Yorikado, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 16 days.

(21) Appl. No.: 15/315,441

(22) PCT Filed: May 13, 2015

(86) PCT No.: PCT/JP2015/063733
§ 371 (c)(1),
(2) Date: Dec. 1, 2016

(87) PCT Pub. No.: WO2015/198733
PCT Pub. Date: Dec. 30, 2015

(65) Prior Publication Data
US 2017/0201726 A1 Jul. 13, 2017

(30) Foreign Application Priority Data
Jun. 26, 2014 (JP) ................................. 2014-130998

(51) Int. Cl.
*H04N 5/335* (2011.01)
*H04N 9/04* (2006.01)
(Continued)

(52) U.S. Cl.
CPC ............. *H04N 9/045* (2013.01); *G02B 5/003* (2013.01); *G02B 5/201* (2013.01);
(Continued)

(58) Field of Classification Search
CPC ....... H04N 2209/045–2209/046; H04N 9/045; H04N 5/378; G02B 5/201; G02B 5/003; H01L 27/14645; H01L 27/14612
(Continued)

(56) References Cited

U.S. PATENT DOCUMENTS

2005/0270594 A1* 12/2005 Kobayashi ........ H01L 27/14621
358/482
2006/0158547 A1 7/2006 Komatsu et al.
(Continued)

FOREIGN PATENT DOCUMENTS

CN 1702873 A 11/2005
CN 1825607 A 8/2006
(Continued)

OTHER PUBLICATIONS

International Search Report and Written Opinion of PCT Application No. PCT/JP2015/063733, dated Sep. 1, 2015, 2 pages of English Translation and 7 pages of ISRWO.

*Primary Examiner* — Xi Wang
(74) *Attorney, Agent, or Firm* — Chip Law Group

(57) ABSTRACT

[Object] To prevent crosstalk between color filters and the resulting variation in sensitivity between pixels while suppressing the increase in manufacturing cost.
[Solution] Provided is a solid state imaging device including: a plurality of photoelectric conversion units configured to receive incident light on a light receiving surface and generate a signal charge; color filters of at least three colors provided to correspond one-to-one to the plurality of photoelectric conversion units; and a partition wall formed between adjacent ones of the color filters so as to contain a color material of the same color as a color filter of a color different from colors of the adjacent color filters.

12 Claims, 16 Drawing Sheets

(51) Int. Cl.
  *H04N 5/378* (2011.01)
  *G02B 5/20* (2006.01)
  *G02B 5/00* (2006.01)
  *H01L 27/146* (2006.01)

(52) U.S. Cl.
  CPC .. *H01L 27/14605* (2013.01); *H01L 27/14612* (2013.01); *H01L 27/14621* (2013.01); *H01L 27/14623* (2013.01); *H01L 27/14627* (2013.01); *H01L 27/14645* (2013.01); *H01L 27/14685* (2013.01); *H04N 5/378* (2013.01); *H04N 2209/045* (2013.01)

(58) Field of Classification Search
  USPC ................................................. 348/273–283
  See application file for complete search history.

(56) References Cited

U.S. PATENT DOCUMENTS

| | | | |
|---|---|---|---|
| 2010/0053266 A1* | 3/2010 | Ito | ............................ G02B 5/201 347/40 |
| 2010/0315541 A1 | 12/2010 | Egawa | |
| 2011/0074991 A1 | 3/2011 | Sakoh et al. | |
| 2013/0134537 A1* | 5/2013 | Nakajiki | ........... H01L 27/14627 257/432 |
| 2013/0208172 A1 | 8/2013 | Tashiro et al. | |
| 2014/0339665 A1* | 11/2014 | Tani | ....................... G02B 5/201 257/432 |
| 2014/0346629 A1 | 11/2014 | Naya et al. | |

FOREIGN PATENT DOCUMENTS

| | | |
|---|---|---|
| CN | 103137638 A | 6/2013 |
| JP | 2005-340299 A | 12/2005 |
| JP | 2006-295125 A | 10/2006 |
| JP | 2009-111225 A | 5/2009 |
| JP | 2010-034426 A | 2/2010 |
| JP | 2010-288150 A | 12/2010 |
| JP | 2013-115335 A | 6/2013 |
| JP | 2013-165216 A | 8/2013 |
| JP | 2013-179575 A | 9/2013 |
| KR | 10-2006-0048083 A | 5/2006 |
| KR | 10-2014-0135722 A | 11/2014 |
| TW | 200539436 A | 12/2005 |
| WO | 2010/013432 A1 | 2/2010 |
| WO | 2013/121742 A1 | 8/2013 |

* cited by examiner

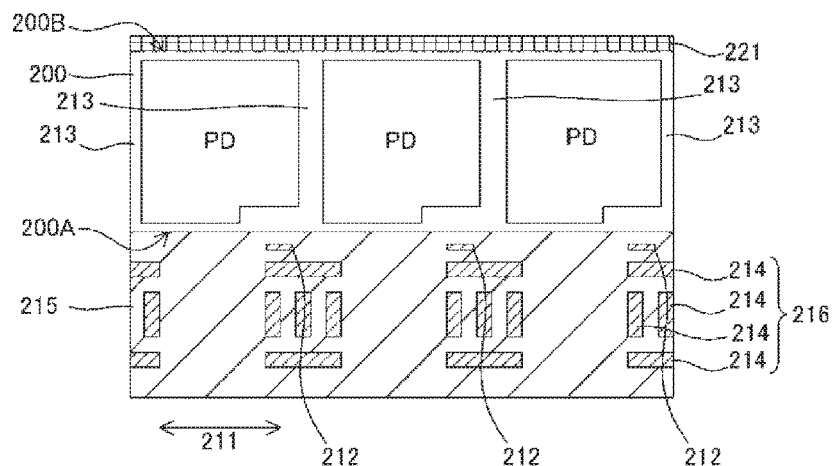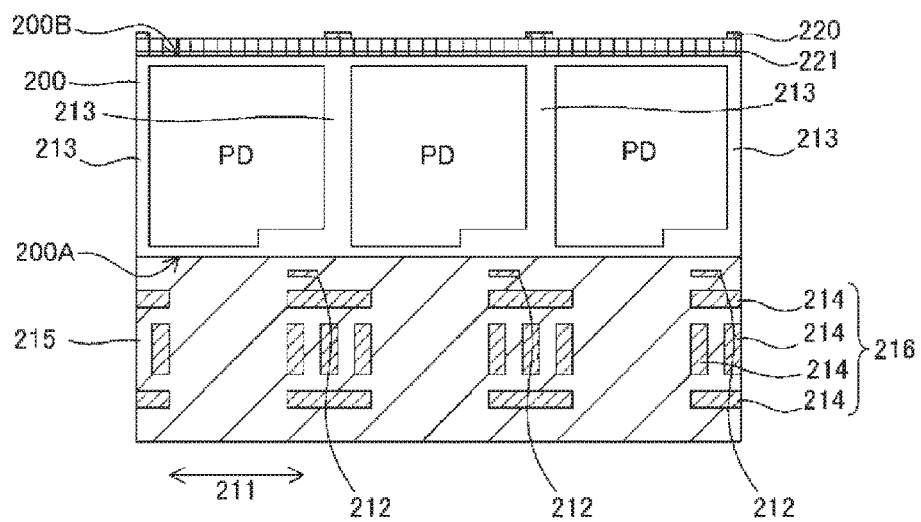

SOLID STATE IMAGING DEVICE, ELECTRONIC APPARATUS, AND METHOD FOR MANUFACTURING SOLID STATE IMAGING DEVICE

CROSS REFERENCE TO RELATED APPLICATIONS

This application is a U.S. National Phase of International Patent Application No. PCT/JP2015/063733 filed on May 13, 2015, which claims priority benefit of Japanese Patent Application No. JP 2014-130998 filed in the Japan Patent Office on Jun. 26, 2014. Each of the above-referenced applications is hereby incorporated herein by reference in its entirety.

TECHNICAL FIELD

The present technology relates to a solid state imaging device, an electronic apparatus, and a method for manufacturing a solid state imaging device.

BACKGROUND ART

Thus far, imaging devices including various image sensors such as a complementary metal oxide semiconductor (CMOS) and a charge-coupled device (CCD) have been proposed, and these imaging devices are in practical use generally as color imaging devices. The color imaging device includes a photoelectric conversion element such as a photodiode that converts incident light to a charge and a color filter that colors light incident on the light receiving surface of the photoelectric conversion element.

Part of the light incident on the light receiving surface of the photoelectric conversion element via the color filter is obliquely incident on the light receiving surface. There is a possibility of the occurrence of crosstalk (color mixing) in which the obliquely incident light is incident on one of the adjacent color filters, then goes across the boundary between the color filters and enters the other color filter, and is, as it is, incident on the photoelectric conversion element for the other color filter. Consequently, there has been a possibility that a variation will occur in sensitivity between pixels.

To prevent such crosstalk, Patent Literature 1 discloses a technology in which the periphery of, among color filters consisting of three colors of red, green, and blue, only the red color filter is provided with a partition wall formed of a material having a lower refractive index than the red, blue, and green color filters.

CITATION LIST

Patent Literature

Patent Literature 1: JP 2013-165216A

SUMMARY OF INVENTION

Technical Problem

However, to perform the technology described in Patent Literature 1 described above, the manufacturing cost is increased. That is, to make a partition wall out of a different material (a material with a different refractive index) from red, green, and blue between the color filters consisting of three colors of red, green, and blue, the selection of the different material, the addition of a new step of forming a partition wall out of the different material, the fabrication of a resist mask in a lithography step, etc. are needed, and these lead to increases in manufacturing cost.

In the present technology, while such increases in manufacturing cost are suppressed, crosstalk between color filters and the resulting variation in sensitivity between pixels are prevented.

Solution to Problem

An aspect of the present technology is a solid state imaging device including: a plurality of photoelectric conversion units configured to receive incident light on a light receiving surface and generate a signal charge; color filters of at least three colors provided to correspond one-to-one to the plurality of photoelectric conversion units; and a partition wall formed between adjacent ones of the color filters so as to contain a color material of the same color as a color filter of a color different from colors of the adjacent color filters.

An aspect of the present technology is an electronic apparatus including: a solid state imaging device; an optical system configured to guide incident light to the solid state imaging device; and a signal processing circuit configured to process an output signal of the solid state imaging device. The solid state imaging device includes a plurality of photoelectric conversion units configured to receive incident light on a light receiving surface and generate a signal charge, color filters of at least three colors provided to correspond one-to-one to the plurality of photoelectric conversion units, and a partition wall formed between adjacent ones of the color filters so as to contain a color material of the same color as a color filter of a color different from colors of the adjacent color filters.

An aspect of the present technology is a method for manufacturing a solid state imaging device, including: a first step of, in a semiconductor substrate, forming photoelectric conversion units configured to receive incident light on a light receiving surface and generate a signal charge; a second step of, above the light receiving surfaces of the photoelectric conversion units, providing color filters of at least three colors configured to color the incident light and transmit the colored incident light to the light receiving surface, in correspondence with the plurality of photoelectric conversion units; and a third step of, between ones of the color filters provided adjacently, forming a partition wall containing a color material of the same color as a color filter of a color different from colors of the color filters provided adjacently.

The solid state imaging device and the electronic apparatus according to the present technology include various aspects such as being used in a state of being incorporated in another device and being used together with another method. Further, the method for manufacturing a solid state imaging device according to the present technology includes various aspects such as being used as part of another method. The present technology may be embodied also as an imaging system including the solid state imaging device or the electronic apparatus, a driving method including a step corresponding to the configuration of the solid state imaging device or the electronic apparatus, a program for causing a computer to execute a function corresponding to the configuration of the driving method, a computer-readable recording medium in which the program is recorded, etc.

Advantageous Effects of Invention

According to the present technology, while the increase in manufacturing cost is suppressed, crosstalk between color filters and the resulting variation in sensitivity between pixels can be prevented. The effects described in this specification are only examples, and the effect of the present technology is not limited to these effects and may have additional effects.

BRIEF DESCRIPTION OF DRAWINGS

FIG. 9 is a diagram describing a method for manufacturing a solid state imaging device.

FIG. 10 is a diagram describing a method for manufacturing a solid state imaging device.

DESCRIPTION OF EMBODIMENT(S)

Hereinbelow, the present technology is described in the following order.
(A) First embodiment
(B) Second embodiment
(C) Third embodiment
(D) Fourth embodiment
(E) Fifth embodiment (A) First Embodiment

[Rough Configuration]

Figure 1:
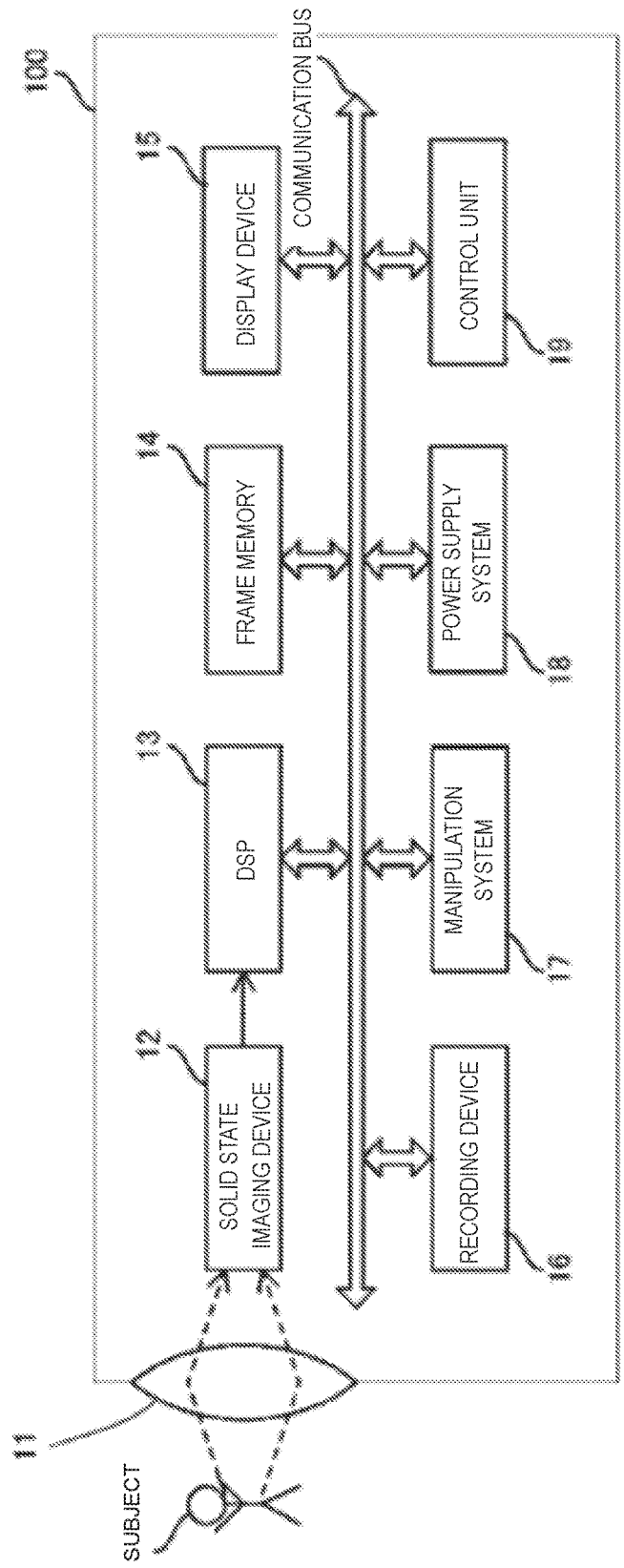
FIG. 1 is a block diagram showing the configuration of an imaging apparatus including a solid state imaging device.

FIG. 1 is a block diagram showing the configuration of an imaging apparatus 100 including a solid state imaging device. The imaging apparatus 100 shown in the drawing is an example of the electronic apparatus.

In this specification, the imaging apparatus refers to all kinds of electronic apparatuses using a solid state imaging device for an image capture unit (a photoelectric conversion unit), including imaging apparatuses such as digital still cameras and digital video cameras and mobile terminal devices such as mobile phones having an imaging function. Also copying machines using a solid state imaging device for an image reading unit are included in the electronic apparatus using a solid state imaging device for an image capture unit, as a matter of course. The imaging apparatus, including the solid state imaging device, may be modularized in order to be installed in the electronic apparatuses described above.

In FIG. 1, the imaging apparatus 100 includes an optical system 11 including a lens group, a solid state imaging device 12, a digital signal processor (DSP) 13 as a signal processing circuit that processes an output signal of the solid state imaging device 12, a frame memory 14, a display device 15, a recording device 16, a manipulation system 17, a power supply system 18, and a control unit 19.

The DSP 13, the frame memory 14, the display device 15, the recording device 16, the manipulation system 17, the power supply system 18, and the control unit 19 are connected to each other via a communication bus so as to be allowed to mutually transmit and receive data and signals.

The optical system 11 captures incident light (image light) from a subject, and forms an image on the imaging surface of the solid state imaging device 12. The solid state imaging device 12 generates, in units of pixels, an electrical signal in accordance with the amount of received incident light that is formed as an image on the imaging surface by the optical system 11, and outputs the electrical signal as a pixel signal. The pixel signal is inputted to the DSP 13 and is subjected to various image processings as appropriate, and is then stored in the frame memory 14, recorded on a recording medium of the recording device 16, or outputted to the display device 15.

The display device 15 is formed of a panel display device such as a liquid crystal display device or an organic electroluminescence (EL) display device, and displays moving images or still images captured by the solid state imaging device 12 and other information. The recording device 16 records moving images or still images captured by the solid state imaging device 12 on a recording medium such as a digital versatile disk (DVD), a hard disk (HD), or a semiconductor memory.

The manipulation system 17 accepts various manipulations from a user, and transmits a manipulation instruction in accordance with the manipulation of the user to the units 13, 14, 15, 16, 18, and 19 via the communication bus. The power supply system 18 generates various power supply voltages serving as driving power sources, and supplies the voltages to supply destinations (the units 12, 13, 14, 15, 16, 17, and 19) as appropriate.

The control unit 19 includes a CPU that performs arithmetic processing, a ROM that stores a control program of the imaging apparatus 100, a RAM that functions as a work area of the CPU, etc. The CPU executes the control program stored in the ROM while using the RAM as a work area, and thereby the control unit 19 controls the units 13, 14, 15, 16, 17, and 18 via the communication bus. Further, the control unit 19 controls a not-shown timing generator and causes it to generate various timing signals, and makes the control of supplying the timing signals to the units.

[Electrical Configuration of the Solid State Imaging Device]

Figure 2:
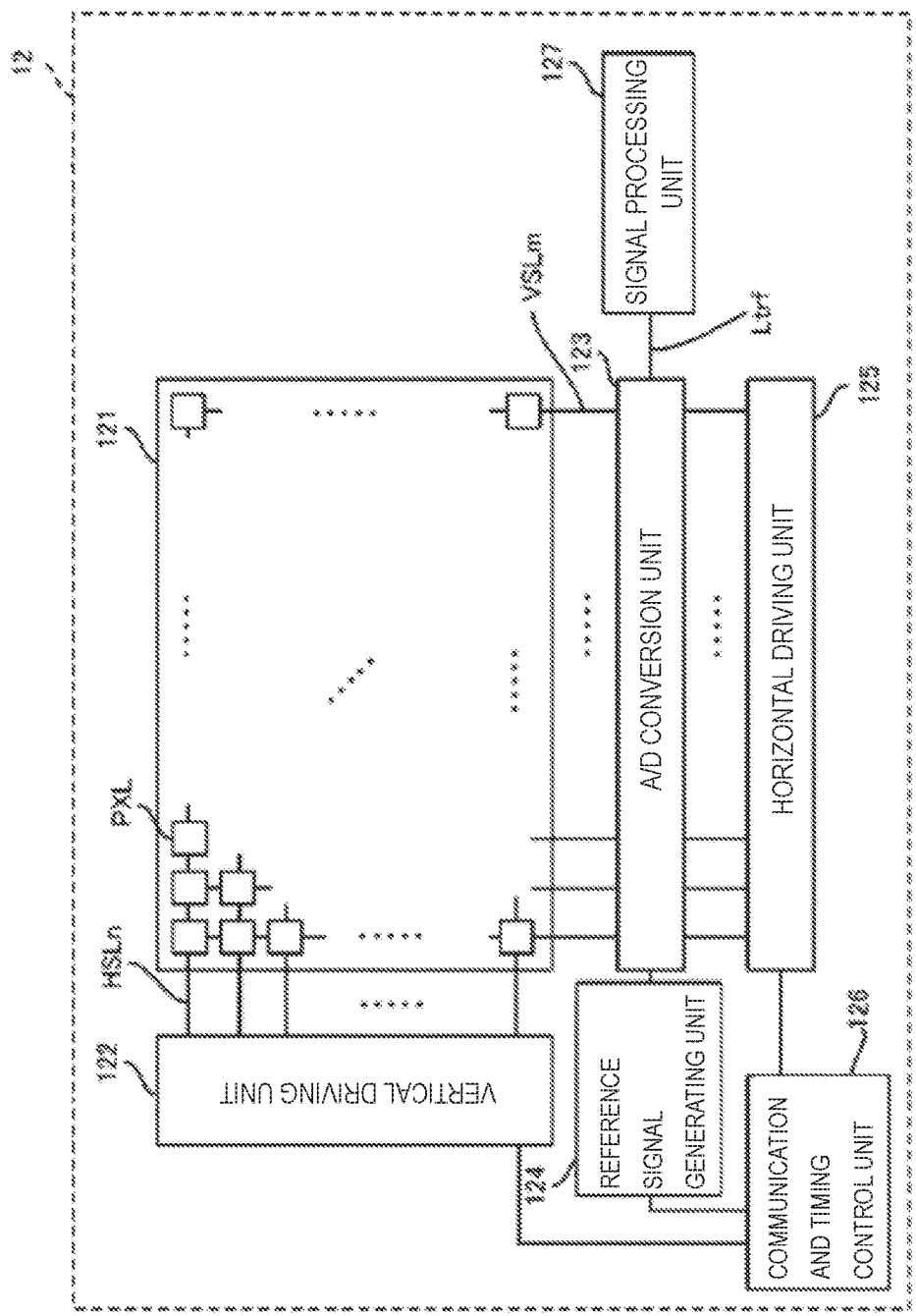
FIG. 2 is a block diagram showing the configuration of the solid state imaging device.

FIG. 2 is a block diagram showing the configuration of the solid state imaging device 12. In the embodiment, a description is given using a CMOS image sensor, which is a kind of X-Y address-type solid state imaging device, as an example of the solid state imaging device, but also a CCD image sensor may be used as a matter of course. A specific example of the solid state imaging device as a CMOS image sensor will now be described with reference to FIG. 2.

In FIG. 2, the solid state imaging device 12 includes a pixel unit 121, a vertical driving unit 122, an analog/digital conversion unit 123 (an A/D conversion unit 123), a reference signal generating unit 124, a horizontal driving unit 125, a communication and timing control unit 126, and a signal processing unit 127.

In the pixel unit 121, a plurality of pixels PXL each including a photodiode as a photoelectric conversion unit are arranged in a two-dimensional matrix configuration. A color filter array in which the color of filters is divided to correspond to each pixel is provided on the light receiving surface side of the pixel unit 121. A specific circuit configuration of the pixel PXL is described later.

In the pixel unit 121, n pixel driving lines HSLn (n=1, 2, ... ) and m vertical signal lines VSLm (m=1, 2, ... ) are drawn. The pixel driving lines HSLn are drawn along the left and right direction (the pixel arrangement direction of the pixel row; the horizontal direction) of the drawing, and are arranged at regular intervals in the up and down direction of the drawing. The vertical signal lines VSLm are drawn along the up and down direction (the pixel arrangement direction of the pixel column; the vertical direction) of the drawing, and are arranged at regular intervals in the left and right direction of the drawing.

One end of the pixel driving line HSLn is connected to an output terminal corresponding to each row of the vertical driving unit 122. The vertical signal line VSLm is connected to the pixels PXL of each column, and one end of the vertical signal line VSLm is connected to the A/D conversion unit 123. Under the control of the communication and timing control unit 126, the vertical driving unit 122 and the horizontal driving unit 125 perform the control of sequentially reading out analog signals from the pixels PXL constituting the pixel unit 121. Specific connections of the pixel driving line HSLn and the vertical signal line VSLm to each pixel PXL are described later together with a description of the pixel PXL.

The communication and timing control unit 126 includes, for example, a timing generator and a communication interface. The timing generator generates various clock signals on the basis of a clock (a master clock) inputted from the outside. The communication interface receives data etc. that command operating modes given from the outside of the solid state imaging device 12, and outputs data including inside information of the solid state imaging device 12 to the outside.

The communication and timing control unit 126 generates, on the basis of a master clock, a clock with the same frequency as the master clock, a clock with a frequency obtained by dividing that frequency by 2, a clock of a low speed with a frequency obtained by dividing that frequency more, etc., and supplies the clocks to the units in the device (the vertical driving unit 122, the horizontal driving unit 125, the A/D conversion unit 123, the reference signal generating unit 124, the signal processing unit 127, etc.).

The vertical driving unit 122 is composed of, for example, a shift register, an address decoder, etc. The vertical driving unit 122 includes a vertical address setting unit for controlling row addresses and a row scanning control unit for controlling row scanning, which controls are based on a signal obtained by decoding a video signal inputted from the outside.

The vertical driving unit 122 can perform read scanning and sweep scanning.

The read scanning is scanning that sequentially selects unit pixels from which a signal is to be read out. The read scanning is basically performed sequentially in units of rows; but in the case where the outputs of a plurality of pixels in a prescribed positional relationship are added or averaged to thin out pixels, the read scanning is performed in a prescribed order.

The sweep scanning is scanning that resets the unit pixels belonging to a row or a pixel combination to be read out by read scanning, prior to the read scanning by a time equal to the time of the shutter speed.

The horizontal driving unit 125 sequentially selects ADC circuits constructing the A/D conversion unit 123 in synchronization with a clock outputted by the communication and timing control unit 126. The A/D conversion unit 123 includes ADC circuits provided individually for the vertical signal lines VSLm (m=1, 2, ... ); and converts an analog signal outputted from each vertical signal line VSLm to a digital signal, and outputs the digital signal to a horizontal signal line Ltrf in accordance with the control of the horizontal driving unit 125.

The horizontal driving unit 125 includes, for example, a horizontal address setting unit and a horizontal scanning unit; and selects each ADC circuit of the A/D conversion unit 123 corresponding to a reading column in the horizontal direction prescribed by the horizontal address setting unit, and thereby guides a digital signal generated in the selected ADC circuit to the horizontal signal line Ltrf.

The digital signal thus outputted from the A/D conversion unit 123 is inputted to the signal processing unit 127 via the horizontal signal line Ltrf. The signal processing unit 127 performs the processing of converting the signal outputted from the pixel unit 121 via the A/D conversion unit 123 to an image signal corresponding to the color arrangement of the color filter array by arithmetic processing.

The signal processing unit 127 performs, as necessary, the processing of thinning out pixel signals in the horizontal direction or the vertical direction by addition, averaging, or the like. The image signal thus generated is outputted to the outside of the solid state imaging device 12.

The reference signal generating unit 124 includes a digital/analog converter (DAC); and generates a reference signal Vramp (see FIG. 4 etc. described later) in synchronization with a count clock supplied from the communication and timing control unit 126. The reference signal Vramp is a saw-tooth-like wave (a ramp waveform) that changes over time in a staircase configuration from the initial value supplied from the communication and timing control unit 126. The reference signal Vramp is supplied to each ADC circuit of the A/D conversion unit 123.

The A/D conversion unit 123 includes a plurality of ADC circuits. When A/D-converting an analog voltage outputted from each pixel PXL, the ADC circuit compares, using a comparator, the reference signal Vramp and the voltage of the vertical signal line VSLm in a prescribed A/D conversion period (the P phase period or the D phase period described later), and counts, using a counter, the time before or after the magnitude relationship between the reference signal Vramp and the voltage of the vertical signal line VSLm (the pixel voltage) is reversed. Thereby, a digital signal corresponding to the analog pixel voltage can be generated. A specific example of the A/D conversion unit 123 is described later.

[Configuration of the Pixel]

Figure 3:
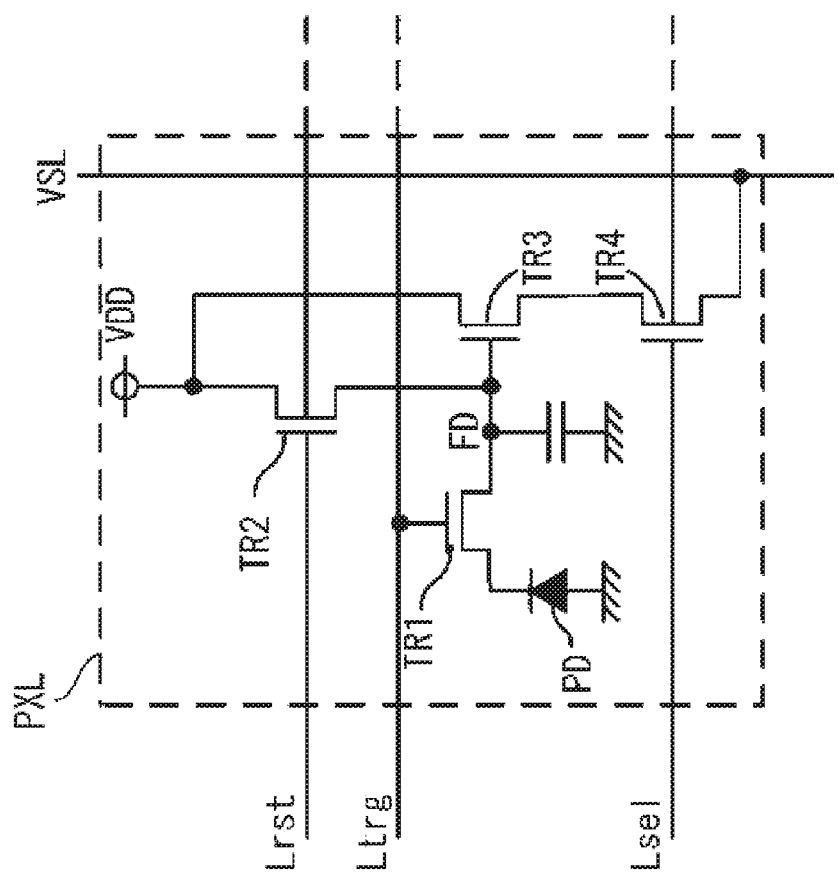
FIG. 3 is a diagram describing the circuit configuration of a pixel.

FIG. 3 is a diagram describing the circuit configuration of a pixel. In the drawing, an equivalent circuit of a pixel of a common four-transistor system configuration is shown. The pixel shown in the drawing includes a photodiode PD and four transistors (a transfer transistor TR1, a reset transistor TR2, an amplifying transistor TR3, and a select transistor TR4).

The photodiode PD generates a current in accordance with the amount of received light by photoelectric conversion. The anode of the photodiode PD is connected to the ground, and the cathode of the photodiode PD is connected to the drain of the transfer transistor TR1.

Various control signals are inputted to the pixel PXL from a reset signal generating circuit of the vertical driving unit 122 and various drivers via signal lines Ltrg, Lrst, and Lsel.

A signal line Ltrg for transmitting a transfer gate signal is connected to the gate of the transfer transistor TR1. The source of the transfer transistor TR1 is connected to a connection point between the source of the reset transistor TR2 and the gate of the amplifying transistor TR3. The connection point forms a floating diffusion FD that is a capacitance that stores a signal charge.

The transfer transistor TR1 becomes ON when a transfer signal is inputted to the gate via the signal line Ltrg, and transfers a signal charge (herein, photoelectrons) stored by the photoelectric conversion of the photodiode PD to the floating diffusion FD.

A signal line Lrst for transmitting a reset signal is connected to the gate of the reset transistor TR2, and a constant voltage source VDD is connected to the drain of the reset transistor TR2. The reset transistor TR2 becomes ON when a reset signal is inputted to the gate via the signal line Lrst, and resets the floating diffusion FD to the voltage of the constant voltage source VDD. On the other hand, the reset transistor TR2 is OFF when a reset signal is not inputted to the gate via the signal line Lrst, and forms a prescribed potential barrier between the floating diffusion FD and the constant voltage source VDD.

In the amplifying transistor TR3, the gate is connected to the floating diffusion FD, the drain is connected to the constant voltage source VDD, and the source is connected to the drain of the select transistor TR4.

In the select transistor TR4, a signal line Lsel of a select signal is connected to the gate, and the source is connected to the vertical signal line VSL. The select transistor TR4 becomes ON when a control signal (an address signal or a select signal) is inputted to the gate via the signal line Lsel, and is OFF when a control signal is not inputted to the gate via the signal line Lsel.

When the select transistor TR4 becomes ON, the amplifying transistor TR3 amplifies the voltage of the floating diffusion FD, and outputs the amplified voltage to the vertical signal line VSL. The voltage outputted from each pixel via the vertical signal line VSL is inputted to the A/D conversion unit 123.

The circuit configuration of the pixel may be, as well as the configuration shown in FIG. 3, various known configurations such as three-transistor system configurations and other four-transistor system configurations. For example, as another four-transistor system configuration, a configuration in which the select transistor TR4 is placed between the amplifying transistor TR3 and the constant voltage source VDD is given.

[A/D Conversion Unit]

Figure 4:
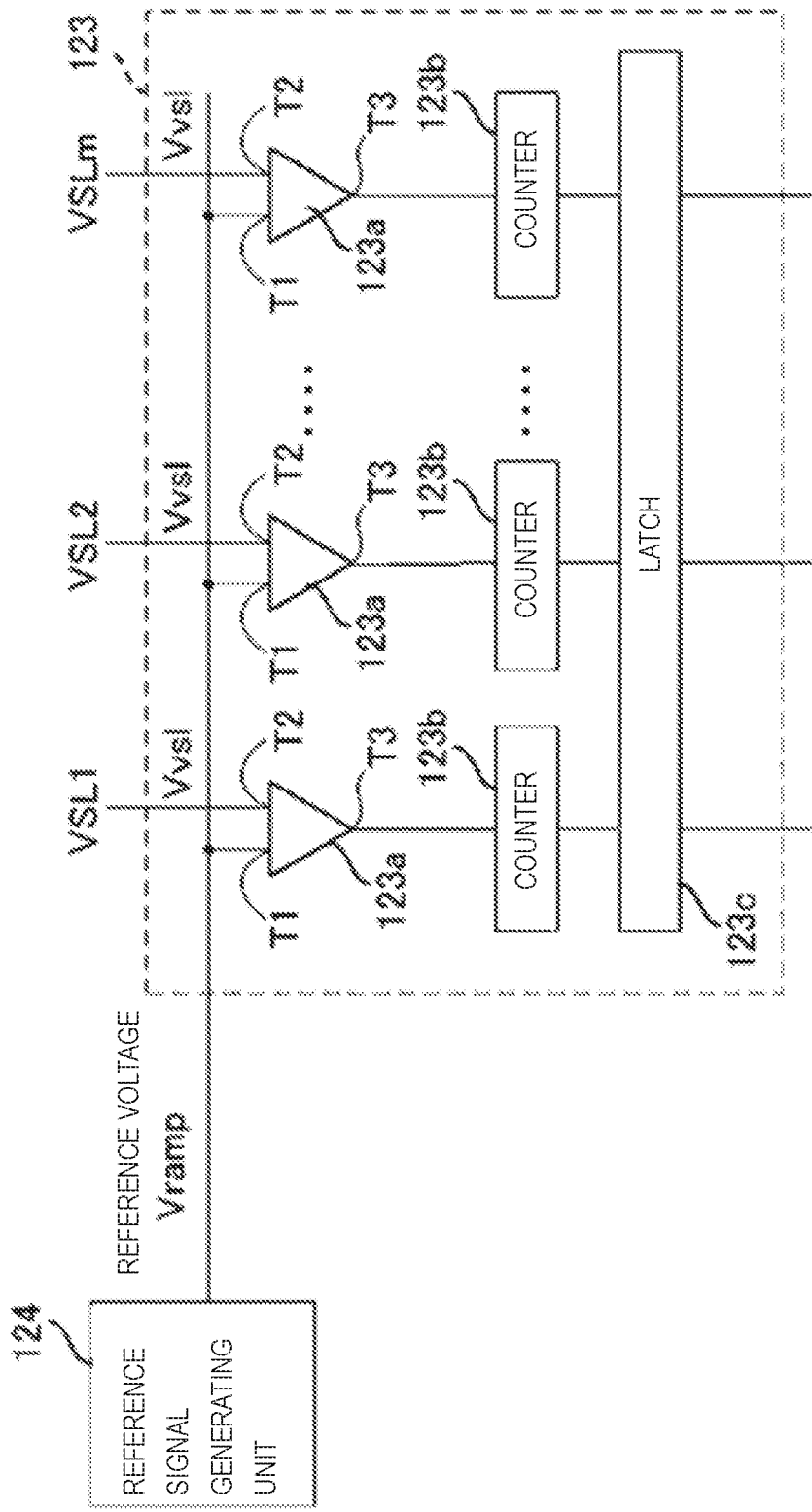
FIG. 4 is a diagram showing the configuration of an A/D conversion unit.

FIG. 4 is a diagram showing the configuration of the A/D conversion unit 123. As shown in the drawing, each of the ADC circuits constituting the A/D conversion unit 123 includes a comparator 123a and a counter 123b provided for each vertical signal line VSLm, and a latch 123c.

The comparator 123a includes two input terminals T1 and T2 and one output terminal T3. A reference signal Vramp is inputted to the one input terminal T1 from the reference signal generating unit 124, and an analog pixel signal outputted from the pixel via the vertical signal line VSL (hereinafter, referred to as a pixel signal Vvsl) is inputted to the other input terminal T2.

The comparator 123a compares the reference signal Vramp and the pixel signal Vvsl. The comparator 123a is designed so as to output a signal of a high level or a low level in accordance with the magnitude relationship between the reference signal Vramp and the pixel signal Vvsl; when the magnitude relationship between the reference signal Vramp and the pixel signal Vvsl is reversed, the output of the output terminal T3 is inverted between a high level and a low level.

The counter 123b is supplied with a clock from the communication and timing control unit 126, and uses the clock to count the time from the start to finish of A/D conversion. The timings of the start and finish of A/D conversion are specified on the basis of a control signal outputted by the communication and timing control unit 126 (for example, the presence or absence of input of a clock signal CLK etc.) and the output inversion of the comparator 123a.

Further, the counter 123b A/D-converts the pixel signal by what is called correlated double sampling (CDS). Specifically, in accordance with the control of the communication and timing control unit 126, the counter 123b performs down-counting while an analog signal corresponding to a reset component remains outputted from the vertical signal line VSLm. With the count value obtained by the down-counting as the initial value, the counter 123b performs up-counting while an analog signal corresponding to a pixel signal remains outputted from the vertical signal line VSLm.

The count value thus generated is a digital value equivalent to the difference between the signal component and the reset component. That is, the count value is a value obtained by calibrating, with the reset component, a digital value corresponding to the analog pixel signal inputted to the A/D conversion unit 123 from the pixel via the vertical signal line VSLm.

The digital values generated by the counters 123b are stored in the latch 123c, and are sequentially outputted from the latch 123c in accordance with the control of the horizontal scanning unit and are outputted to the signal processing unit 127 via the horizontal signal line Ltrf.

[Physical Configuration of the Solid State Imaging Device]

Figure 5:
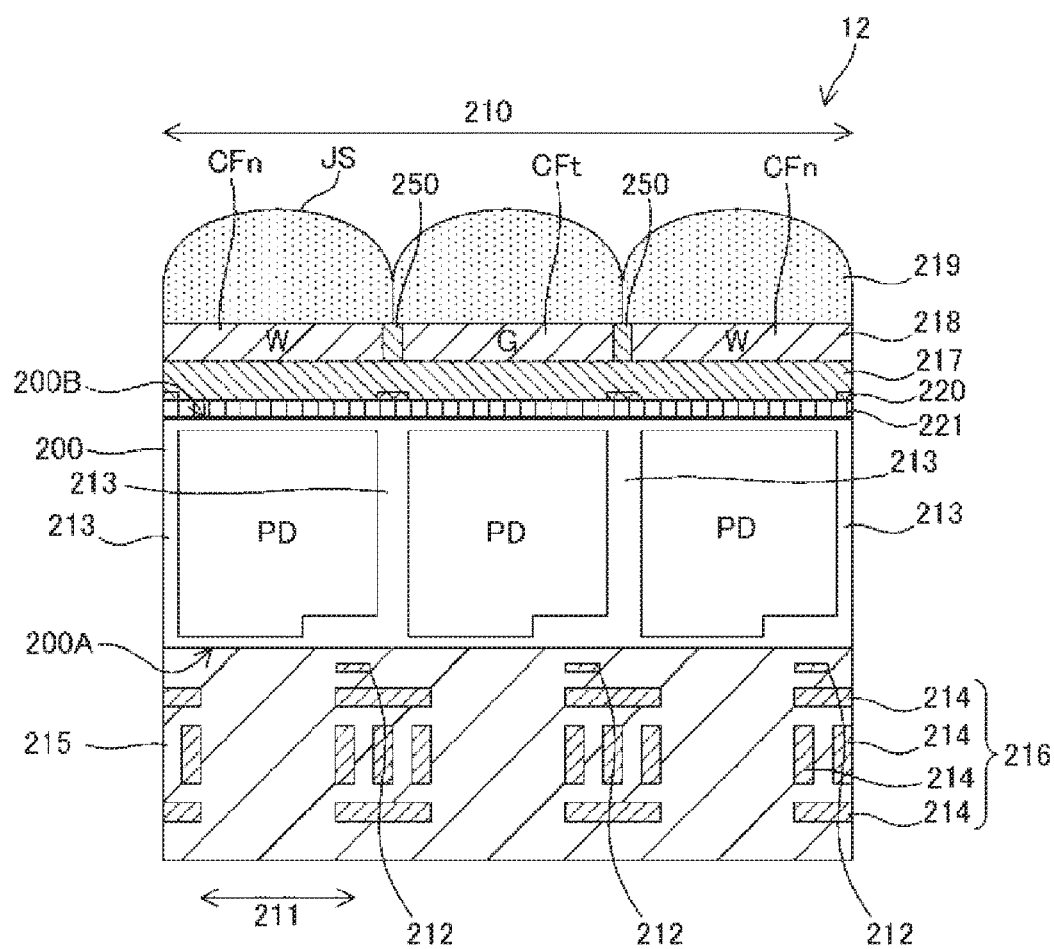
FIG. 5 is a diagram cross-sectionally showing the structure of a main part of the solid state imaging device.

FIG. 5 is a diagram cross-sectionally showing the structure of a main part of the solid state imaging device 12. Although in the embodiment a description is given using a back-side illumination CMOS image sensor as an example, the present technology can be applied also to a front-side illumination CMOS image sensor.

The solid state imaging device 12 shown in the drawing is a back-side illumination CMOS image sensor, and is configured by, for example, forming a pixel region 210 (what is called an imaging region) in which a plurality of unit pixels 211 are arranged on a semiconductor substrate 200 made of silicon and a peripheral circuit unit (not shown) placed around the pixel region 210.

A pixel transistor is formed on the side of the substrate front surface 200A, and in FIG. 5 the presence of the pixel transistor is schematically shown by showing a gate electrode 212. Each photodiode PD is isolated by an element isolation region 213 formed of an impurity diffusion layer.

[Multilayer Interconnection Layer]

On the front surface side of the semiconductor substrate 200 where the pixel transistor is formed, a multilayer interconnection layer 216 in which a plurality of interconnections 214 are formed is formed via an interlayer insulating film 215. Therefore, in the back-side illumination CMOS image sensor, the interconnection 214 can be formed regardless of the position of the photodiode PD.

[Interlayer Insulating Film]

On the back surface of the semiconductor substrate 200 faced by the photodiode PD, an interlayer insulating film 221 functioning as an anti-reflection film is formed. The interlayer insulating film 221 has a stacked structure in which a plurality of films with refractive indices different from each other are stacked. The interlayer insulating film 221 is formed of, for example, a two-layer structure in which a hafnium oxide ($HfO_2$) film and a silicon oxide film ($SiO_2$) are stacked in this order from the side of the semiconductor substrate 200. The hafnium oxide film is a high permittivity insulating layer (a high-k film) with a higher permittivity than the silicon oxide film. Other than these, also a silicon nitride film may be used in the interlayer insulating film 221.

[Light Blocking Film]

On the interlayer insulating film 221, a light blocking film 220 is formed in a portion corresponding to the pixel boundary. The light blocking film 220 may be a material that blocks light, and is preferably formed of a material that has a strong light blocking effect and can be microfabricated, for example a material that can be processed by etching with good accuracy. More specifically, aluminum (Al), tungsten (W), or copper (Cu) is given as an example.

[Planarizing Film and Color Filter]

A planarizing film 217 is formed on the interlayer insulating film 221 and the light blocking film 220, and a color filter layer 218 composed of a plurality of color filters that are formed so as to individually correspond to the photodiodes PD is formed on the planarizing film 217. In the embodiment, a description is given using, as an example, a color filter layer 218 in which color filters of four colors that are three primary colors of red, green, and blue and white as well are arranged in a checkered pattern. Although a description is given using a filter of a primary color system as an example in the embodiment and other embodiments described later, the present technology can be applied also to a filter of a complementary color system.

A red color filter 218R is configured to contain a red color material that, in the visible light range, transmits red light in a long wavelength range (approximately 600 to 700 nm) and absorbs the light other than red light, and a green color filter 218G is configured to contain a green color material that, in the visible light range, transmits green light in an intermediate wavelength range (approximately 500 to 600 nm) and absorbs the light other than green light. A blue color filter 218B is configured to contain a blue color material that, in the visible light range, transmits blue light in a short wavelength range (approximately 400 to 500 nm) and absorbs the light other than blue light, and a white color filter 218W is configured using a material that transmits light in the visible light range overall, for example a transparent material. The portion of the white color filter 218W may be formed of a transparent layer in place of the color filter layer 218.

Figure 6:
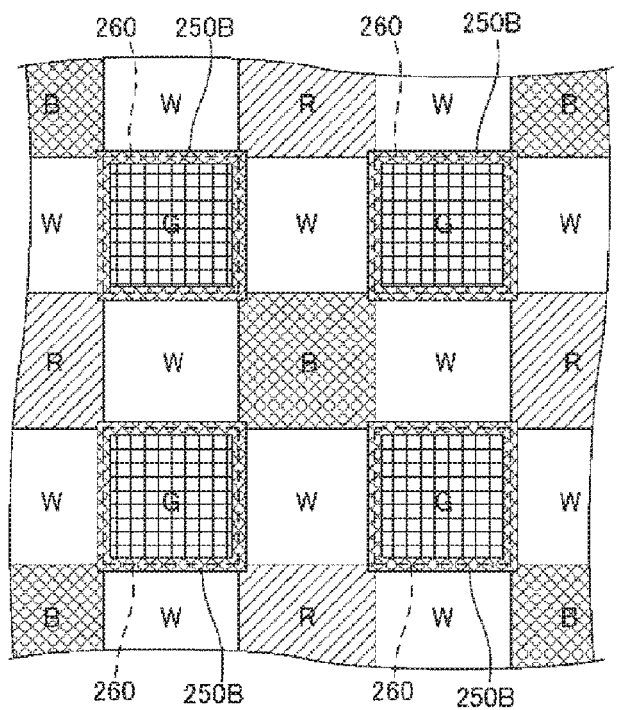
FIGS. 6(a), 6(b) are diagrams describing partition walls.
Figure 6:
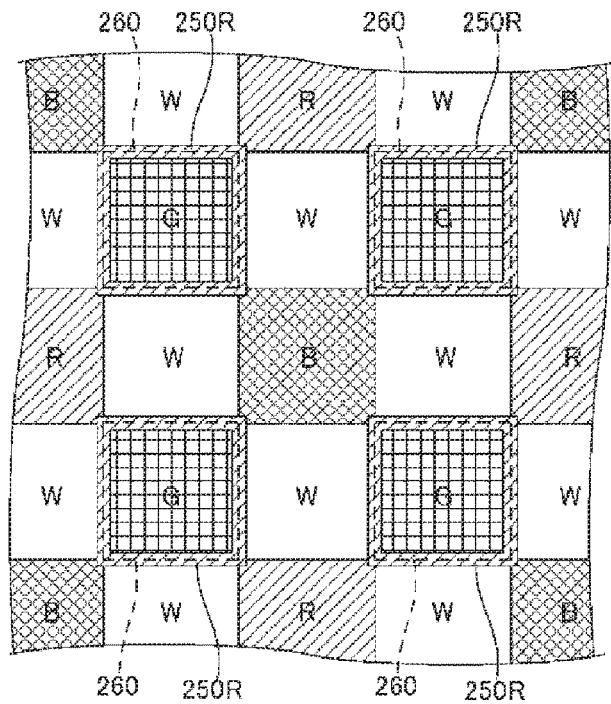

In the color filter layer 218, for example as shown in FIGS. 6(a), 6(b), the white color filters 218W and the other color filters are alternately arranged. Therefore, a color filter of a color other than white (red, green, or blue) is provided adjacent to the white color filter 218W, and the white color filter 218W is provided adjacent to the color filters of the colors other than white (red, green, and blue).

The color filters of the colors other than white (red, green, and blue) are provided such that the proportion of green color filters 218G is made larger than the proportion of red color filters 218R or blue color filters 218B, for example in a ratio of red: 1, blue: 1, and green: 2. The arrangement is made such that the green color filter 218G is located diagonally adjacent to the blue color filter 218B and the red color filter 218R.

[Partition Wall]

In the embodiment, when at least one of the color filters of these colors (red, green, blue, or white) is taken as a target color filter CFt, between the target color filter CFt and an adjacent color filter CFn provided adjacent to at least one side of the target color filter, a partition wall 250 that is configured to contain a color material of the same color as another colored color filter (red, green, or blue) of a color different from the colors of both the adjacent color filter CFn and the target color filter CFt is formed. The partition wall 250 is described later in detail.

[Microlens]

Microlenses 219 are formed on the upper surface of the color filter layer 218 so as to individually correspond to the photodiodes PD. The microlens 219 is, as shown in FIG. 5, provided on the back surface of the semiconductor substrate 200 on the upper side of the color filter layer 218. The plurality of microlenses 219 are arranged in the same shape so as to correspond to the plurality of photodiodes PD arranged in the pixel region 210. The microlens 219 is a convex lens formed such that the center is thicker than the edge in the direction from the light receiving surface JS toward the side of the color filter layer 218, and is configured so as to collect and transmit incident light substantially to the center of the light receiving surface of each photodiode PD.

[Configuration of Color Filters]

FIGS. 6(a), 6(b) are diagrams describing partition walls 250 according to the embodiment. The drawing shows the color filter layer 218 in a planar view.

[Blue Partition Wall]

In the example shown in FIG. 6(a), along the boundary 260 extending along between the white color filter 218W and the green color filter 218G provided adjacently, a partition wall containing the same color material as a color filter that is not adjacent across the boundary 260, namely, a blue partition wall 250B containing a color material of the same color as the blue color filter 218B is formed. More specifically, a blue partition wall 250B containing the same color material as the blue color filter 218B is formed along the boundary 260.

By providing the blue partition wall 250B along the boundary 260 between the white color filter 218W and the green color filter 218G, crosstalk between the white color filter 218W and the green color filter 218G with spectral characteristics similar to each other (in the case of the blue partition wall, particularly crosstalk with light of longer wavelengths than 550 nm) is avoided. Furthermore, by forming the blue partition wall 250B using the same color material as the blue color filter 218B, the cost increase due to adding a step of forming a partition wall can be suppressed.

In the blue partition wall 250B, also materials other than the color material may be the same material as the blue color filter 218B; for example, the matrix may be in common with the blue color filter 218B. Further, the content ratio of the color material to the matrix in the blue partition wall 250B may be made to substantially coincide with that of the blue color filter 218B, or the content ratio may be made different from that of the blue color filter 218B; for example, the content ratio may be set higher than that of the blue color filter 218B.

In the example shown in FIG. 6(a), the blue partition wall 250B is formed along the boundary 260 extending along between the white color filter 218W and the green color filter 218G, and is formed so as to surround the green color filter 218G. Consequently, the white color filter 218W is in contact with a layer containing a blue color material on the three sides except the side adjacent to the red color filter 218R.

The color arrangement of the color filter layer according to the embodiment is a configuration in which at least one of the corners of the green color filter 218G (in FIGS. 6(a), 6(b), two corners) is in contact with a corner of the blue color filter 218B, and therefore the blue partition wall 250B surrounding the green color filter 218G is continuous with the corner of the blue color filter 218B.

At the boundary 260 at which the blue partition wall 250B is formed, the blue partition wall 250B is formed with a certain width; therefore, the areas of formation of the color filters formed on both sides across the blue partition wall 250B formed at the boundary 260 are eaten away by an amount equal to the width and are formed narrow. In the example shown in FIG. 6(a), the blue partition wall 250B is formed along the boundary 260 between the green color filter 218G and the white color filter 218W; therefore, the area of formation of the green color filter 218G and the area of formation of the white color filter 218W formed on both sides of the blue partition wall 250B are eaten away by the blue partition wall 250B and become narrow.

[Red Partition Wall]

In the example shown in FIG. 6(b), along the boundary 260 extending along between the white color filter 218W and the green color filter 218G provided adjacently, a partition wall containing the same color material as a color filter that is not adjacent across the boundary 260, namely, a red partition wall 250R containing a color material of the same color as the red color filter 218R is formed. More specifically, a red partition wall 250R containing the same color material as the red color filter 218R is formed along the boundary 260.

By providing the red partition wall 250R along the boundary 260 between the white color filter 218W and the green color filter 218G, crosstalk between the white color filter 218W and the green color filter 218G with spectral characteristics similar to each other (in the case of the red partition wall, particularly crosstalk with light of shorter wavelengths than 550 nm) is avoided. Furthermore, by forming the red partition wall 250R using the same color material as the red color filter 218R, the cost increase due to adding a step of forming a partition wall can be suppressed.

In the red partition wall 250R, also materials other than the color material may be the same material as the red color filter 218R; for example, the matrix may be in common with the red color filter 218R. Further, the content ratio of the color material to the matrix in the red partition wall 250R may be made to substantially coincide with that of the red color filter 218R, or the content ratio may be made different from that of the red color filter 218R; for example, the content ratio may be set higher than that of the red color filter 218R.

In the example shown in FIG. 6(b), the red partition wall 250R is formed along the boundary 260 extending along between the white color filter 218W and the green color filter 218G, and is formed so as to surround the green color filter 218G. Consequently, the white color filter 218W is in contact with a layer containing a red color material on the three sides except the side adjacent to the blue color filter 218B.

The color arrangement of the color filter layer according to the embodiment is a configuration in which at least one of the corners of the green color filter 218G (in FIGS. 6(a), 6(b), two corners) is in contact with a corner of the red color filter 218R; therefore, the red partition wall 250R surrounding the green color filter 218G is continuous with the corner of the red color filter 218R.

At the boundary 260 at which the red partition wall 250R is formed, the red partition wall 250R is formed with a certain width; therefore, the areas of formation of the color filters formed on both sides across the red partition wall 250R formed at the boundary 260 are eaten away by an amount equal to the width and are formed narrow. In the example shown in FIG. 6(b), the red partition wall 250R is formed at the boundary 260 between the green color filter 218G and the white color filter 218W; therefore, the area of formation of the green color filter 218G and the area of formation of the white color filter 218W formed on both sides of the red partition wall 250R are eaten away by the red partition wall 250R and become narrow.

By forming the partition wall 250 such as the blue partition wall 250B or the red partition wall 250R described above, while the increase in manufacturing cost is suppressed, crosstalk between color filters and the resulting variation in sensitivity between pixels can be prevented. This measure is effective particularly in a place where the image height is high in the angle of view because crosstalk is likely to occur in this place.

[Relationship Between the Partition Wall and the Light Blocking Film]

Figure 7:
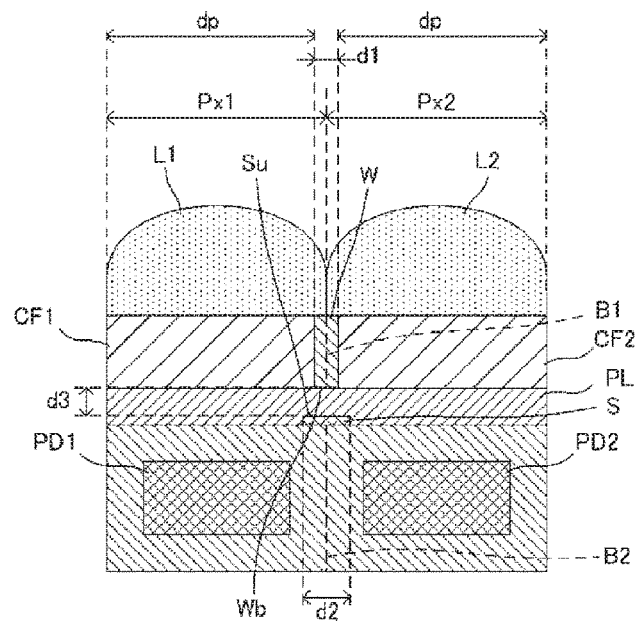
FIG. 7 is a diagram describing the relationship between the partition wall and a light blocking film.
Figure 8:
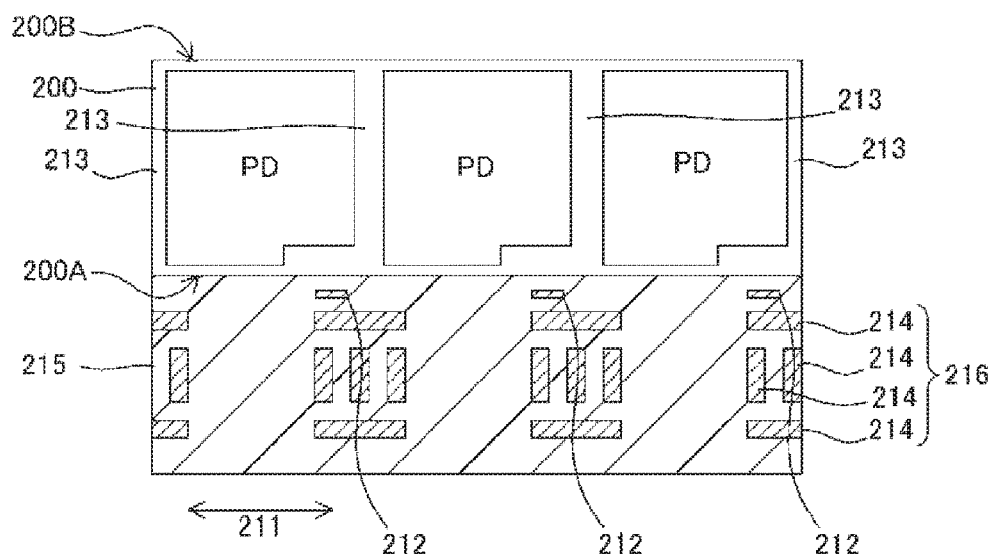
FIG. 8 is a diagram describing a method for manufacturing a solid state imaging device.

FIG. 7 is a diagram describing the relationship between the partition wall and the light blocking film. The drawing cross-sectionally shows a main part of the solid state imaging device 12.

In the drawing, the solid state imaging device 12 is formed such that a first pixel Px1 and a second pixel Px2 are adjacent to each other.

The first pixel Px1 includes a first photodiode PD1 as a photoelectric conversion element, and a first color filter CF1 as a coloring element for coloring incident light and a first on-chip lens L1 as a light collecting element for collecting incident light on the light receiving surface of the first photodiode PD1 are stacked in order on the light receiving surface side of the first photodiode PD1.

The second pixel Px2 includes a second photodiode PD2 as a photoelectric conversion element, and a second color filter CF2 as a coloring element for coloring incident light and a second on-chip lens L2 as a light collecting element for collecting incident light on the light receiving surface of the second photodiode PD2 are stacked in order on the light receiving surface side of the second photodiode PD2.

A planarizing film PL common to the first pixel Px1 and the second pixel Px2 is formed between the first photodiode PD1 and the first color filter CF1 and between the second photodiode PD2 and the second color filter CF2.

A partition wall W is formed between the first color filter CF1 and the second color filter CF2 formed adjacent to each other, along the boundary B1 between the color filters. Further, a light blocking film S is formed in the planarizing film PL on the boundary B2 between the first photodiode PD1 and the second photodiode PD2 formed adjacent to each other, along the boundary B2. The partition wall W and the light blocking film S are formed in a positional relationship of being offset from each other substantially in the up and down direction on FIG. 7. When a position adjustment for what is called pupil correction etc. is not performed, the boundary B1 and the boundary B2 are located on the same straight line extending in the up and down direction on FIG. 7.

The light blocking film S is formed with a width that does not obstruct the light receiving surfaces of the first photodiode PD1 and the second photodiode PD2. Therefore, by forming the width d1 of the partition wall in the direction orthogonal to the boundary B1 narrower than the width d2 of the light blocking film, the possibility that the partition wall W will inhibit incident light on the first photodiode PD1 and the second photodiode PD2 can be reduced as much as possible. Thereby, the reduction in light receiving sensitivity due to the formation of the partition wall W can be suppressed.

The spacing d3 between the partition wall W and the light blocking film S is preferably formed as narrow as possible. By setting the spacing d3 narrow, crosstalk going between the bottom surface Wb of the partition wall W and the upper surface Su of the light blocking film S, which are formed facing at the boundary between the first pixel Px1 and the second pixel Px2, is made less likely to occur, and the crosstalk between the first pixel Px1 and the second pixel Px2 can be suppressed. Although a light blocking film S formed along the lower end of the planarizing film PL is shown as an example in FIG. 7, the light blocking film S may be formed apart from the lower end of the planarizing film PL.

[Method for Manufacturing a Solid State Imaging Device]

An example of the method for manufacturing the solid state imaging device 12 described above will now be described.

FIG. 8 to FIG. 13 are diagrams showing a main part of the solid state imaging device 12 in the steps of a method for manufacturing the solid state imaging device 12 according to the embodiment.

[Photodiode Region]

First, a first step of, in a region where the pixel region of the semiconductor substrate 200 is to be formed, forming photodiodes PD as photoelectric conversion units in correspondence with the respective pixels is performed. The photodiode PD is formed to have a p-n junction formed of an n-type semiconductor region extending over the entire area in the direction of the substrate thickness and a p-type semiconductor region formed in contact with the n-type semiconductor region and facing the front and back surfaces of the substrate. The p-type semiconductor region and the n-type semiconductor region are formed by, for example, using the ion implantation method to introduce an impurity into a semiconductor substrate. Each photodiode PD is isolated by an element isolation region formed of a p-type semiconductor.

A p-type semiconductor well region in contact with the element isolation region is formed in a region corresponding to each pixel of the substrate front surface 200A, and a pixel transistor is formed in the p-type semiconductor well region. The pixel transistor is formed of a source region and a drain region, a gate insulating film, and the gate electrode 212. The multilayer interconnection layer 216 in which a plurality of layers of interconnections 214 are arranged via the interlayer insulating film 215 is formed on the substrate front surface 200A.

[Interlayer Film]

Next, as shown in FIG. 9, the interlayer insulating film 221 functioning as an anti-reflection film is formed on the substrate back surface 200B serving as a light receiving surface. The interlayer insulating film 221 is formed by, for example, the thermal oxidation method or the chemical vapor deposition (CVD) method.

[Formation of the Light Blocking Film]

Next, as shown in FIG. 10, on the substrate back surface 200B of the semiconductor substrate 200 via the interlayer insulating film 221, the light blocking film 220 is formed along the boundary line between pixels adjacent to each other. Specifically, a film formation step of forming a light blocking film on the entire surface of the interlayer insulating film 221 and a pattern processing step of pattern-processing the light blocking film by etching are performed to form the light blocking film 220.

As the material of the light blocking film 220, one that has a strong light blocking effect and is suitable for microfabrication, for example capable of being processed by etching with good accuracy, is preferable. As materials having such characteristics, for example, metal materials such as aluminum (Al), tungsten (W), titanium (Ti), and copper (Cu) are given.

The film formation step of the light blocking film 220 is performed by, for example, the sputtering method, the chemical vapor deposition (CVD) method, the plating processing, or the like. Thereby, the metal film of aluminum or the like described above is formed on the entire surface of the interlayer insulating film 221.

In the pattern processing step of the light blocking film 220, a resist mask is formed along a portion corresponding to the boundary between pixels, and the light blocking film 220 in portions where the resist mask is not formed is selectively removed by etching such as wet etching or dry etching. Thereby, the light blocking film 220 remains along the boundary line between pixels adjacent to each other, and a pattern in which the portion of the light receiving surface of the photodiode PD is opened is formed.

[Planarizing Film]

Figure 11:
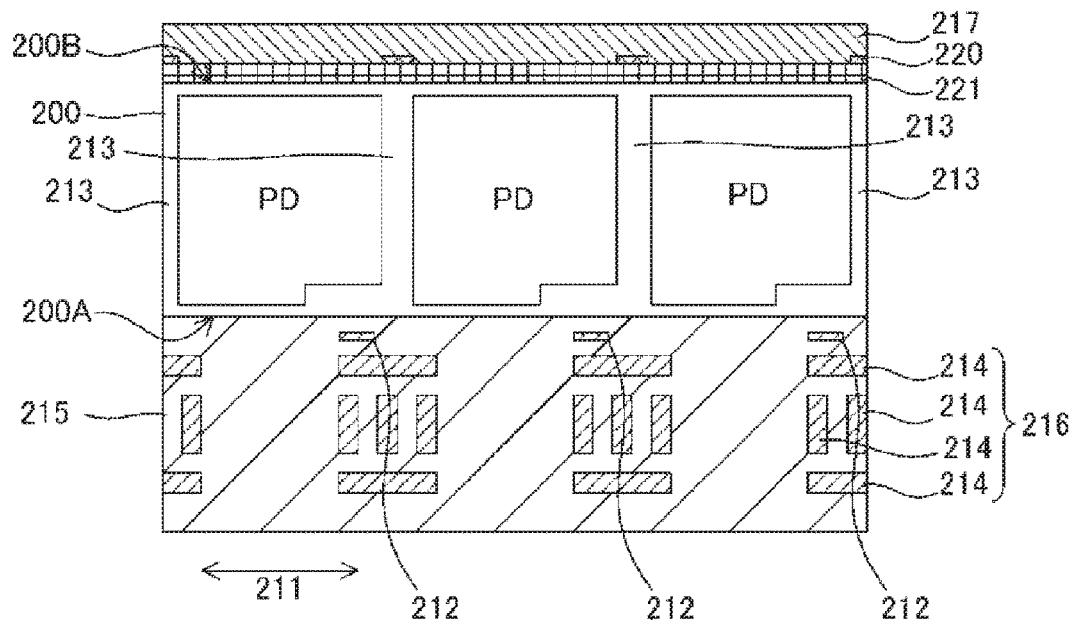
FIG. 11 is a diagram describing a method for manufacturing a solid state imaging device.

Next, as shown in FIG. 11, a transparent planarizing film 217 is formed on the substrate back surface 200B via the interlayer insulating film 221 and the light blocking film 220. The planarizing film 217 is formed by, for example, forming a film of a thermoplastic resin by the spin coating method and then performing thermosetting treatment. Thereby, a state where the light blocking film 220 is provided in the planarizing film 217 is created.

[Color Filter and Partition Wall]

Figure 12:
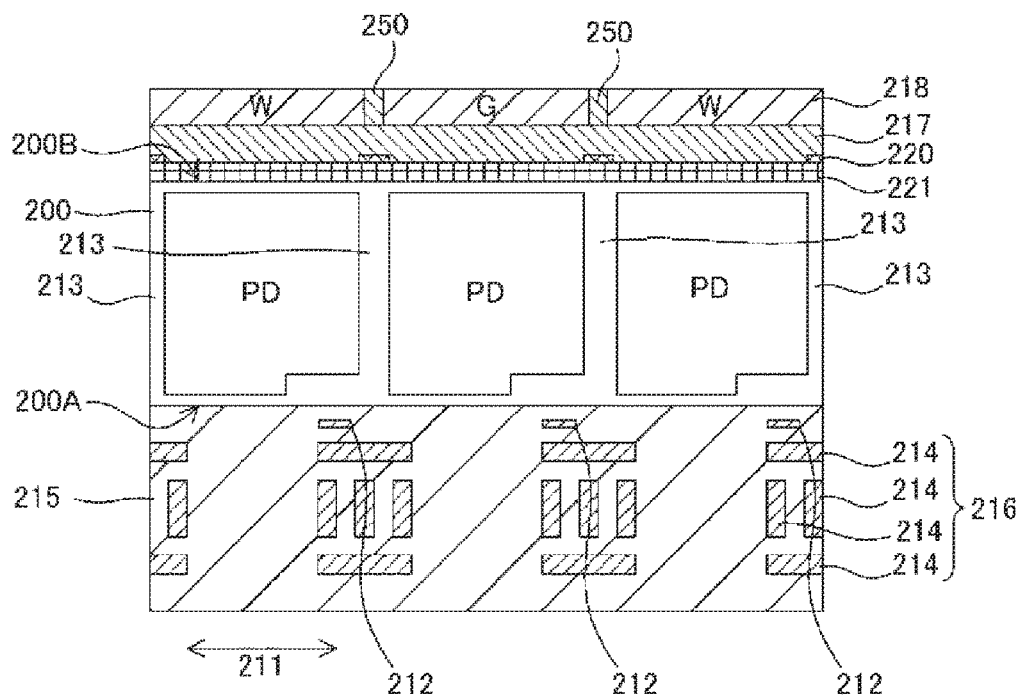
FIG. 12 is a diagram describing a method for manufacturing a solid state imaging device.

Next, as shown in FIG. 12, a second step and a third step of forming the color filter layer 218 and the partition wall 250 on the planarizing film 217 are performed. The color filter layer 218 and the partition wall 250 are formed by, for example, applying an application liquid containing a color material such as a pigment or a dye and a photosensitive resin by a coating method such as the spin coating method and thereby forming a coating film, and pattern-processing the coating film by lithography technology.

In the case where the blue partition wall 250B is formed of the same material as the blue color filter 218B, the blue color filter 218B and the blue partition wall 250B can be formed by the same step; and in the case where the red partition wall 250R is formed of the same material as the red color filter 218R, the red color filter 218R and the red partition wall 250R can be formed by the same step.

The formation of the color filter of each color can be performed in the following manner, for example. First, an application liquid containing a color material for obtaining the spectral characteristics of the color intended to be formed and a photosensitive resin is applied by the spin coating method to form a photoresist film (not shown). After that, pre-baking treatment is performed, and then the photoresist film is subjected to pattern processing; thereby, a color filter of the desired color is formed.

More specifically, for example, the photoresist film is subjected to pattern exposure processing of transferring a pattern image using an i-line reduction exposure apparatus. After that, the photoresist film that has undergone pattern exposure processing is subjected to development processing using an organic alkaline aqueous solution (one in which a non-ionic surfactant is added to tetramethylammonium hydroxide, or the like) as a developing liquid. Then, post-baking treatment is performed; thus, a color filter of the desired color is formed.

[Microlens]

Figure 13:
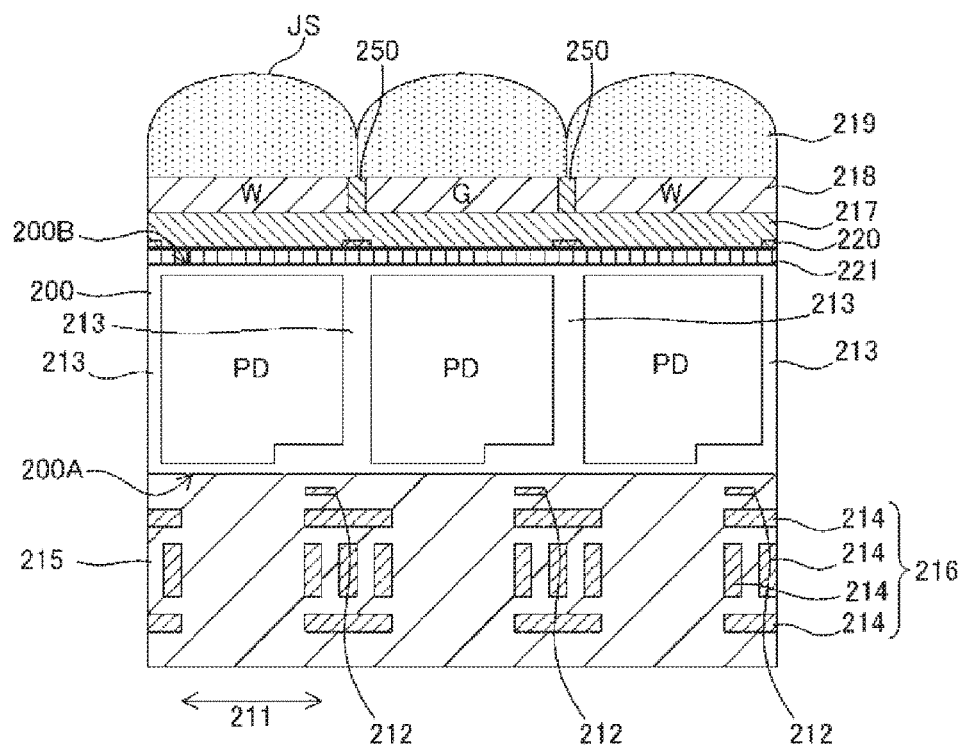
FIG. 13 is a diagram describing a method for manufacturing a solid state imaging device.

Next, as shown in FIG. 13, microlenses 219 are formed on the color filter layer 218. The microlens 219 is formed by, for example, forming a positive photoresist film on the color filter layer 218 and then performing processing. Herein, the microlens 219 is provided as a convex lens in which the center is formed thicker than the edge in the direction from the light receiving surface JS toward the side of the color filter layer 218.

Specifically, a positive photoresist film is formed by the spin coating method using polystyrene as a base resin and using diazonaphthoquinone as a photosensitizer, and pre-baking treatment is performed. Then, exposure processing of applying a pattern image to the positive photoresist film is performed using an i-line reduction exposure apparatus. After that, the photoresist film that has undergone exposure processing is subjected to development processing. In the development processing, for example, an organic alkaline aqueous solution (one in which a non-ionic surfactant is added to tetramethylammonium hydroxide, or the like) is used as a developing liquid. Then, the entire surface is irradiated with ultraviolet light in order to remove color so as to eliminate light absorption in the short wavelength range in visible light. After that, the photoresist film is subjected to heat treatment at a temperature not less than the thermal softening point. Thereby, the microlens 219 is completed.

(B) Second Embodiment

Figure 14:
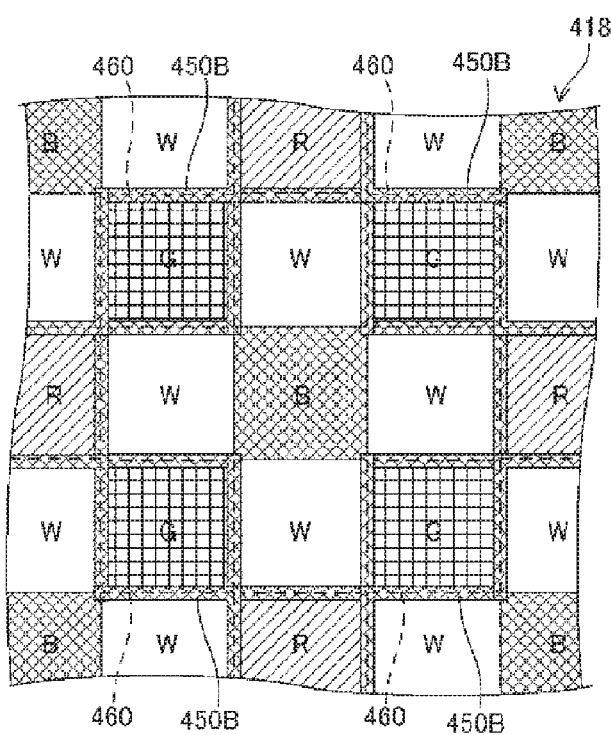
FIG. 14(a), 14(b) are diagrams describing configurations of a solid state imaging device according to a second embodiment.
Figure 14:
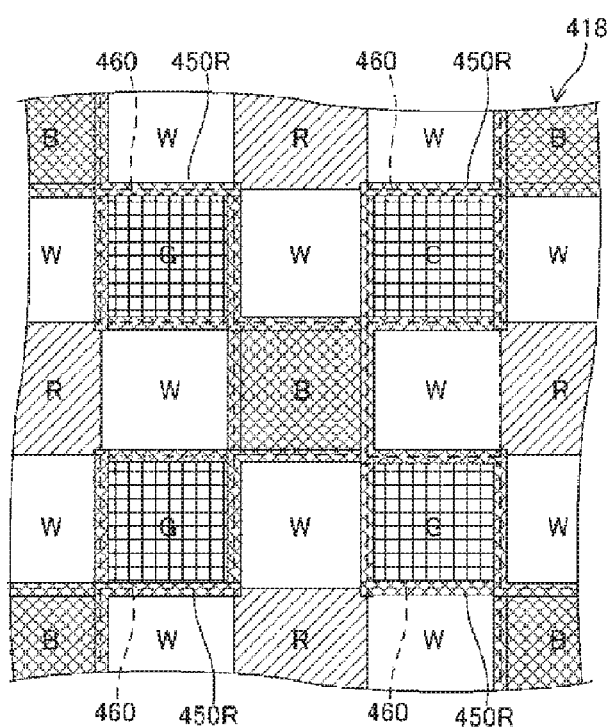

FIGS. 14(a), 14(b) are diagrams describing configurations of a solid state imaging device 412 according to the embodiment. The drawing shows the positional relationship between the color filter and the partition wall in a planar view of a color filter layer 418 of the solid state imaging device 412. In the drawing, 418R, 418G, 418B, and 418W are written simply as "R," "G," "B," and "W." Except for the partition wall, the structure of the solid state imaging device 412 according to the embodiment is similar to the solid state imaging device 12 according to the first embodiment described above, and a detailed description is omitted.

[Blue Partition Wall]

In the example shown in FIG. 14(a), along the boundary 460 extending along between the white color filter 418W and the green color filter 418G provided adjacently, a partition wall containing a color material of the same color as a color filter that is not adjacent across the boundary 460, namely, a blue partition wall 450B containing a color material of the same color as the blue color filter 418B is formed. More specifically, a blue partition wall 450B containing the same color material as the blue color filter 418B is formed along the boundary 460.

By providing the blue partition wall 450B along the boundary 460 between the white color filter 418W and the green color filter 418G, crosstalk between the white color filter 418W and the green color filter 418G with spectral characteristics similar to each other is avoided (in the case of the blue partition wall, particularly crosstalk with light of longer wavelengths than 550 nm). Furthermore, by forming the blue partition wall 450B using the same color material as the blue color filter 418B, the increase in manufacturing cost due to adding a step of forming a partition wall can be suppressed.

In the blue partition wall 450B, also materials other than the color material may be the same material as the blue color filter 418B; for example, the matrix may be in common with the blue color filter 418B. Further, the content ratio of the color material to the matrix in the blue partition wall 450B may be made to substantially coincide with that of the blue color filter 418B, or the content ratio may be made different from that of the blue color filter 418B; for example, the content ratio may be set higher than that of the blue color filter 418B.

In the drawing, the blue partition wall 450B is formed so as to surround the white color filter 418W except for the side adjacent to the blue color filter 418B. In the embodiment, the white color filter 418W is formed in every other position vertically and horizontally in a checkered pattern in the plurality of color filters arranged in a two-dimensional matrix configuration; as a result, the blue partition wall 450B is formed at all the boundaries 460 except for around the blue color filter 418B.

At the boundary 460 at which the blue partition wall 450B is formed, the blue partition wall 450B is formed with a certain width; therefore, the areas of formation of the color filters formed on both sides across the blue partition wall 450B formed at the boundary 460 are eaten away by an amount equal to the width and are formed narrow. In the example shown in FIG. 14(a), the areas of formation of the red color filter 418R and the green color filter 418G are eaten away by the blue partition wall 450B and become narrow on all the four sides, and the area of formation of the white color filter 418W is eaten away by the blue partition wall 450B and becomes narrow except for the side adjacent to the blue color filter 418B.

Also at the boundary 460 on the side adjacent to the blue color filter 418B, an eaten-away portion similar to that in the case where the blue partition wall 450B is formed may be provided to make the area of formation of the white color filter 418W substantially equal to that of the red color filter 418R or the green color filter 418G, as a matter of course.

[Red Partition Wall]

In the example shown in FIG. 14(b), along the boundary 460 extending along between the white color filter 418W and the green color filter 418G provided adjacently, a partition wall containing a color material of the same color as a color filter that is not adjacent across the boundary 460, namely, a red partition wall 450R containing a color material of the same color as the red color filter 418R is formed. More specifically, a red partition wall 450R containing the same color material as the red color filter 418R is formed along the boundary 460.

By providing the red partition wall 450R along the boundary 460 between the white color filter 418W and the green color filter 418G, crosstalk between the white color filter 418W and the green color filter 418G with spectral characteristics similar to each other is avoided (in the case of the red partition wall, particularly crosstalk with light of shorter wavelengths than 550 nm). Furthermore, by forming the red partition wall 450R using the same color material as the red color filter 418R, the increase in manufacturing cost due to adding a step of forming a partition wall can be suppressed.

In the red partition wall 450R, also materials other than the color material may be the same material as the red color filter 418R; for example, the matrix may be in common with the red color filter 418R. Further, the content ratio of the color material to the matrix in the red partition wall 450R may be made to substantially coincide with that of the red color filter 418R, or the content ratio may be made different from that of the red color filter 418R; for example, the content ratio may be set higher than that of the red color filter 418R.

In the drawing, the red partition wall 450R is formed so as to surround the white color filter 418W except for the side adjacent to the red color filter 418R. In the embodiment, the white color filter 418W is formed in every other position vertically and horizontally in a checkered pattern in the plurality of color filters arranged in a two-dimensional matrix configuration; as a result, the red partition wall 450R is formed at all the boundaries 460 except for around the red color filter 418R.

At the boundary 460 at which the red partition wall 450R is formed, the red partition wall 450R is formed with a certain width; therefore, the areas of formation of the color filters formed on both sides across the red partition wall 450R formed at the boundary 460 are eaten away by an amount equal to the width and are formed narrow. In the example shown in FIG. 14(b), the areas of formation of the red color filter 418R and the green color filter 418G are eaten away by the red partition wall 450R and become narrow on all the four sides, and the area of formation of the white color filter 418W is eaten away by the red partition wall 450R and becomes narrow except for the side adjacent to the red color filter 418R.

Also at the boundary 460 on the side adjacent to the red color filter 418R, an eaten-away portion similar to that in the case where the red partition wall 450R is formed may be provided to make the area of formation of the white color filter 418W substantially equal to that of the red color filter 418R or the green color filter 418G, as a matter of course.

By forming the partition wall 450 such as the blue partition wall 450B or the red partition wall 450R described above, while the increase in manufacturing cost is suppressed, crosstalk between color filters and the resulting variation in sensitivity between pixels can be prevented. This measure is effective particularly in a place where the image height is high in the angle of view because crosstalk is likely to occur in this place.

(C) Third Embodiment

Figure 15:
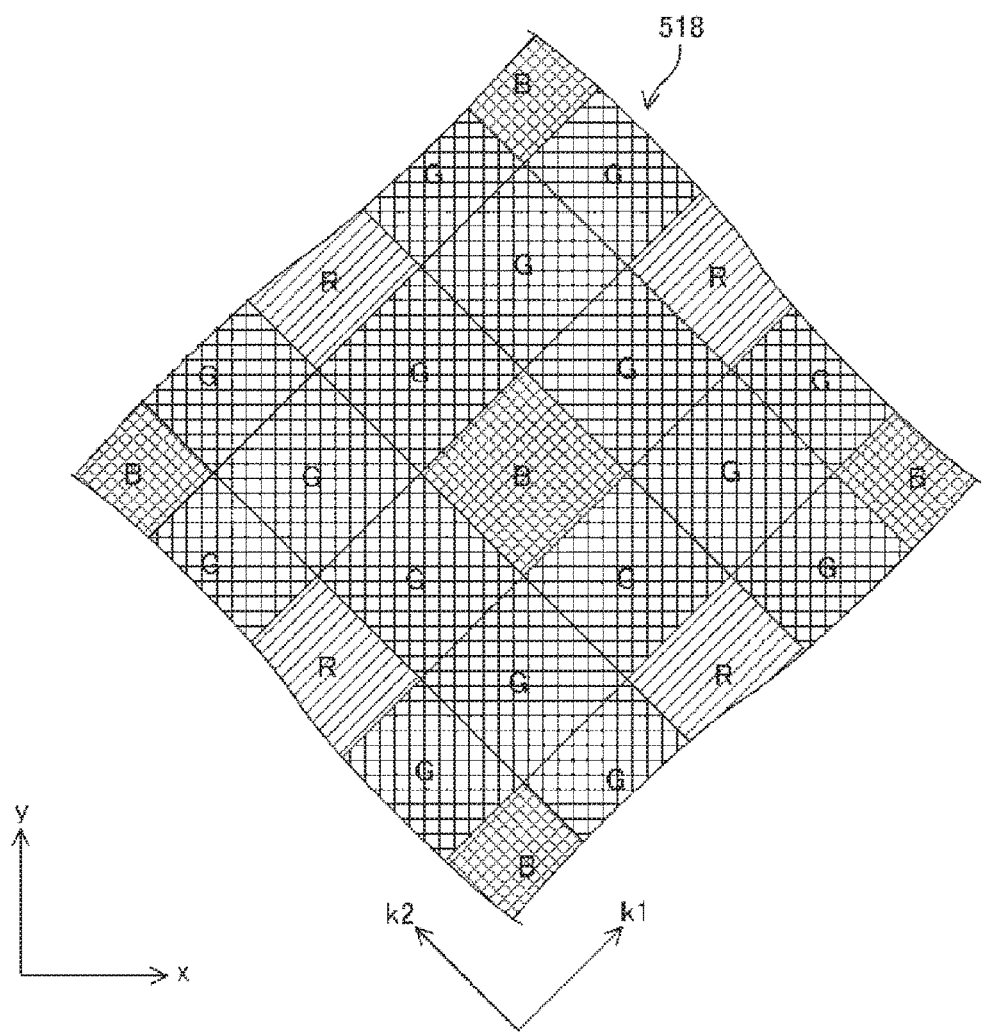
FIG. 15 is a diagram describing configurations of a solid state imaging device according to a third embodiment.

FIG. 15 is a diagram describing the configuration of a solid state imaging device 512 according to the embodiment. The drawing shows the positional relationship between the color filter and the partition wall in a planar view of a color filter layer 518 of the solid state imaging device 512. In the drawing, 518R, 518G, and 518B are written simply as "R," "G," and "B." Except for the color filter, the structure of the solid state imaging device 512 according to the embodiment is similar to the solid state imaging device 12 according to the first embodiment described above, and a detailed description is omitted.

In the color filter layer 518 according to the embodiment, the pixel arrangement is what is called the "ClearVid" array. Specifically, a plurality of pixels P are arranged in each of a first inclination direction k1 and a second inclination direction k2 inclined at an angle of 45° with respect to the horizontal direction x and the vertical direction y, respectively.

The red color filter 518R and the blue color filter 518B are arranged so as to be adjacent via one green color filter 518G in each of the first and second inclination directions k1 and k2. In addition, red color filters 518R are arranged so as to be adjacent via one green color filter 518G in each of the horizontal direction x and the vertical direction y, and similarly blue color filters 518B are arranged so as to be adjacent via one green color filter 518G in each of the horizontal direction x and the vertical direction y.

Thereby, as shown in FIG. 15, the green color filters 518G are formed so as to include a portion extending in each of the first and second inclination directions k1 and k2 in the imaging surface (the xy plane). Further, the green color filters 518G are formed so as to surround the periphery of each of the red color filter 518R and the blue color filter 518B in the imaging surface (the xy plane).

[Blue Partition Wall]

Figure 16:
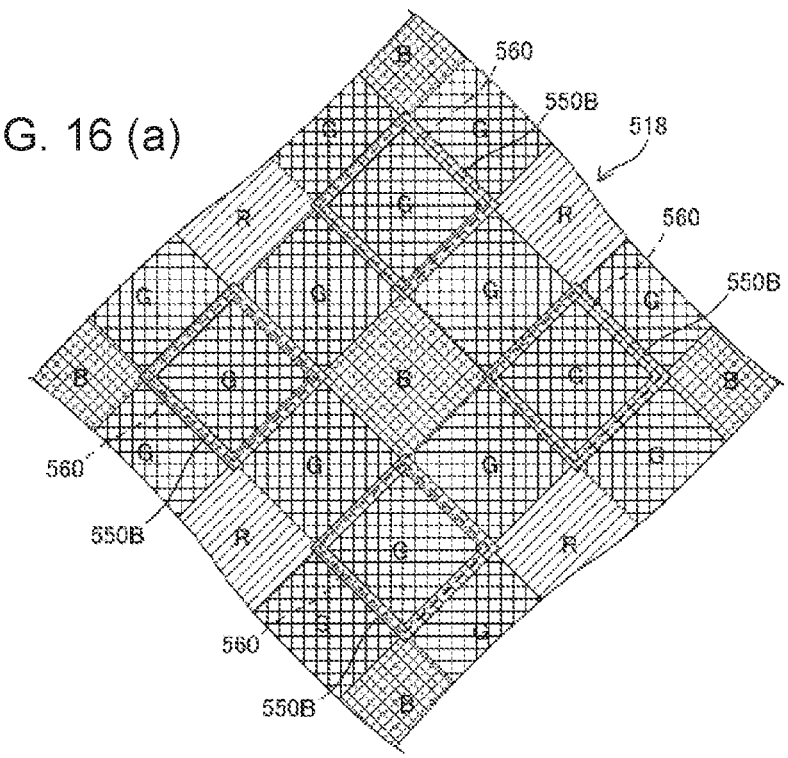
FIGS. 16(a), 16(b) are diagrams describing configurations of a solid state imaging device according to the third embodiment.
Figure 16:
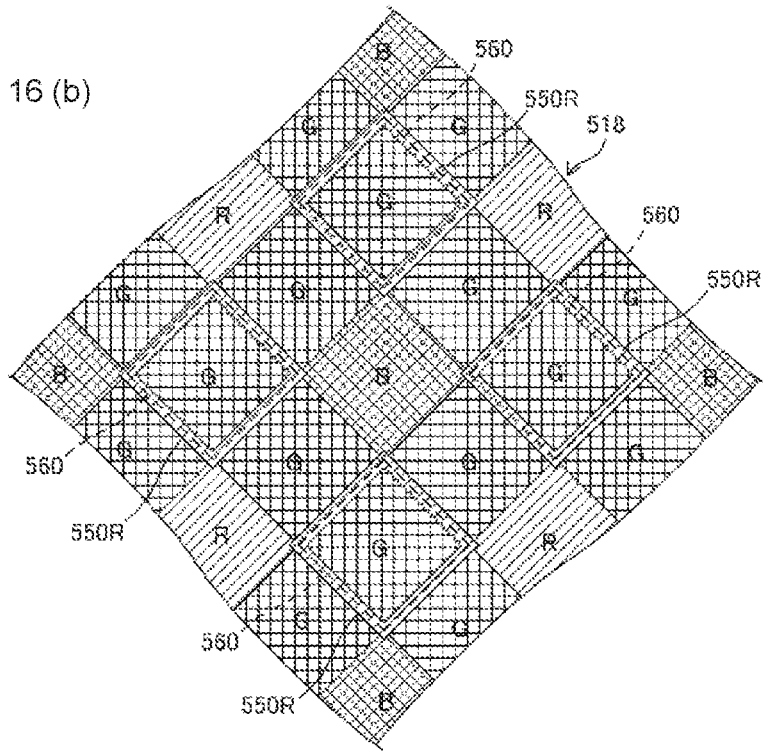

In the example shown in FIG. 16(a), along the boundary 560 extending along between green color filters 518G provided adjacently, a partition wall containing the same color material as a color filter that is not adjacent across the boundary 560, namely, a blue partition wall 550B containing a color material of the same color as the blue color filter 518B is formed. More specifically, a blue partition wall 550B containing the same color material as the blue color filter 518B is formed along the boundary 560.

By providing the blue partition wall 550B along the boundary 560 between adjacent green color filters 518G, crosstalk between green color filters 518G with the same spectral characteristics (in the case of the blue partition wall, particularly crosstalk with light of longer wavelengths than 550 nm) is avoided. Furthermore, by forming the blue partition wall 550B using the same color material as the blue color filter 518B, the increase in manufacturing cost due to adding a step of forming a partition wall can be suppressed.

In the blue partition wall 550B, also materials other than the color material may be the same material as the blue color filter 518B; for example, the matrix may be in common with the blue color filter 518B. Further, the content ratio of the color material to the matrix in the blue partition wall 550B may be made to substantially coincide with that of the blue color filter 518B, or the content ratio may be made different from that of the blue color filter 518B; for example, the content ratio may be set higher than that of the blue color filter 518B.

At the boundary 560 at which the blue partition wall 550B is formed, the blue partition wall 550B is formed with a certain width; therefore, the areas of formation of the green color filters 518G formed on both sides across the blue partition wall 550B formed at the boundary 560 are eaten away by an amount equal to the width and are formed narrow.

Also at the boundary 560 on the side adjacent to the blue color filter 518B, an eaten-away portion similar to that in the case where the blue partition wall 550B is formed may be provided to adjust the area of formation of the green color filter 518G to a substantially equal size to the red color filter 518R or the green color filter 518G, as a matter of course. Also at the boundary between the red color filter 518R and the green color filter 518G, the blue partition wall 550B may be formed to make adjustment so that, like in the green color filter 518G surrounded by the blue partition wall 550B described above, the areas of formation of the red color filter 518R and the green color filter 518G adjacent to each other are eaten away by the blue partition wall 550B.

[Red Partition Wall]

In the example shown in FIG. 16(b), along the boundary 560 extending along between green color filters 518G provided adjacently, a partition wall containing a color material of the same color as a color filter that is not adjacent across the boundary 560, namely, a red partition wall 550R containing a color material of the same color as the red color filter 518R is formed. More specifically, a red partition wall 550R containing the same color material as the red color filter 518R is formed along the boundary 560.

By providing the red partition wall 550R along the boundary 560 between adjacent green color filters 518G, crosstalk between green color filters 518G with the same spectral characteristics is avoided (in the case of the red partition wall, particularly crosstalk with light of shorter wavelengths than 550 nm). Furthermore, by forming the red partition wall 550R using the same color material as the red color filter 518R, the increase in manufacturing cost due to adding a step of forming a partition wall can be suppressed.

In the red partition wall 550R, also materials other than the color material may be the same material as the red color filter 518R; for example, the matrix may be in common with the red color filter 518R. Further, the content ratio of the color material to the matrix in the red partition wall 550R may be made to substantially coincide with that of the red color filter 518R, or the content ratio may be made different from that of the red color filter 518R; for example, the content ratio may be set higher than that of the red color filter 518R.

At the boundary 560 at which the red partition wall 550R is formed, the red partition wall 550R is formed with a certain width; therefore, the areas of formation of the green color filters 518G formed on both sides across the red partition wall 550R formed at the boundary 560 are eaten away by an amount equal to the width and are formed narrow.

Also at the boundary 560 on the side adjacent to the red color filter 518R, an eaten-away portion similar to that in the case where the red partition wall 550R is formed may be provided to adjust the area of formation of the green color filter 518G to a substantially equal size to the red color filter 518R or the green color filter 518G, as a matter of course. Further, also at the boundary between the red color filter 518R and the green color filter 518G, the red partition wall 550R may be formed to make adjustment so that, like in the green color filter 518G surrounded by the red partition wall 550R described above, the areas of formation of the red color filter 518R and the green color filter 518G adjacent to each other are eaten away by the red partition wall 550R.

By forming the partition wall 550 such as the blue partition wall 550B or the red partition wall 550R described above, while the increase in manufacturing cost is suppressed, crosstalk between color filters and the resulting variation in sensitivity between pixels can be prevented. This measure is effective particularly in a place where the image height is high in the angle of view because crosstalk is likely to occur in this place.

(D) Fourth Embodiment

Figure 17:
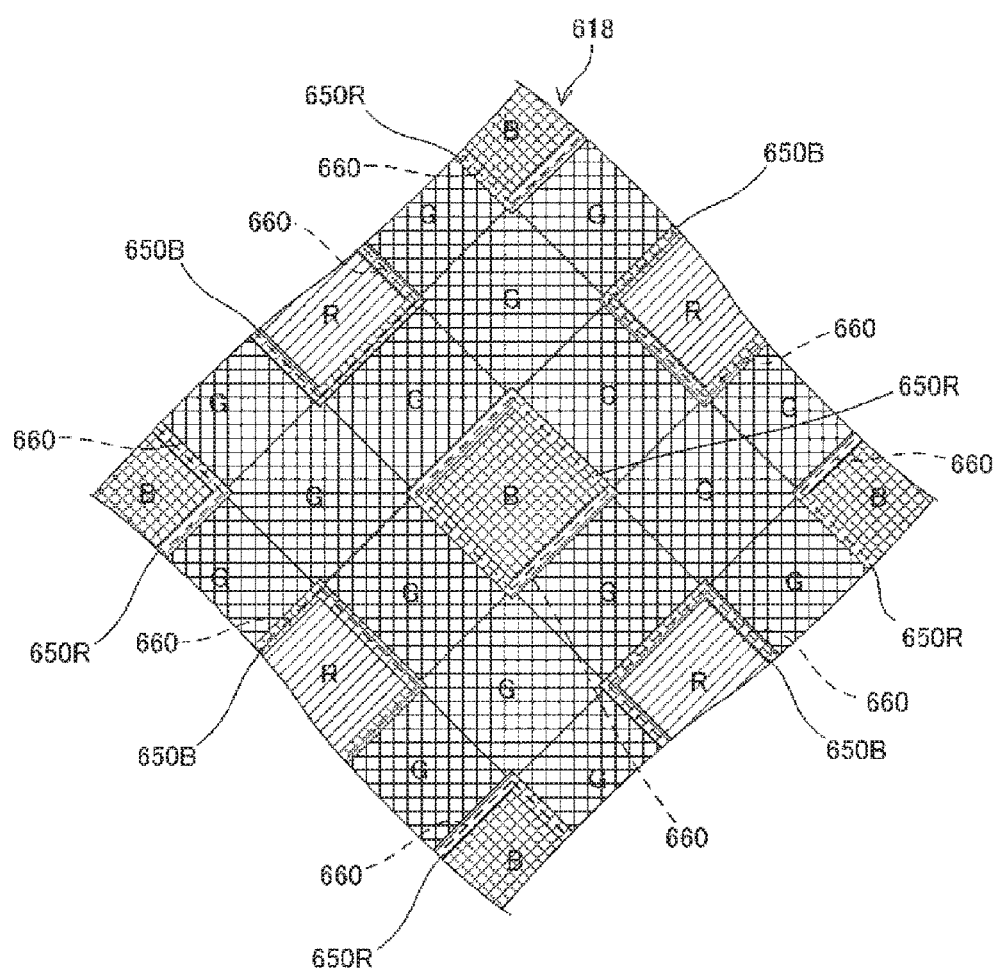
FIG. 17 is a diagram describing configurations of a solid state imaging device according to a fourth embodiment.

FIG. 17 is a diagram describing the configuration of a solid state imaging device 612 according to the embodiment. The drawing shows the positional relationship between the color filter and the partition wall in a planar view of a color filter layer 618 of the solid state imaging device 612. In the drawing, 618R, 618G, and 618B are written simply as "R," "G," and "B." Except for the partition wall, the configuration of the solid state imaging device 612 according to the embodiment is similar to the solid state imaging device 512 according to the third embodiment described above, and a detailed description is omitted.

[Red Partition Wall Around Blue]

In the example shown in FIG. 17, along the boundary 660 extending along between the red color filter 618R and the green color filter 618G provided adjacent to this, a partition wall containing a color material of the same color as a color filter that is not adjacent across the boundary 660, namely, a blue partition wall 650B containing a color material of the same color as the blue color filter 618B is formed. More specifically, a blue partition wall 650B containing the same color material as the blue color filter 618B is formed along the boundary 660.

By thus providing the blue partition wall 650B along the boundary 660 around the red color filter 618R, crosstalk between the red color filter 618R and the green color filter 618G is avoided (in the case of the blue partition wall, particularly crosstalk with light of longer wavelengths than 550 nm). Furthermore, by forming the blue partition wall 650B using the same color material as the blue color filter 618B, the increase in manufacturing cost due to adding a step of forming a partition wall can be suppressed.

On the other hand, along the boundary 660 extending along between the blue color filter 618B and the green color filter 618G provided adjacent to this, a partition wall containing the same color material as a color filter that is not adjacent across the boundary 660, namely, a red partition wall 650R containing the same color material as the red color filter 618R is formed. More specifically, a red partition wall 650R containing the same color material as the red color filter 618R is formed along the boundary 660.

By thus providing the red partition wall 650R along the boundary 660 around the blue color filter 618B, crosstalk between the blue color filter 618B and the green color filter 618G is avoided (in the case of the red partition wall, particularly crosstalk with light of shorter wavelengths than 550 nm). Furthermore, by forming the red partition wall 650R using the same color material as the red color filter 618R, the increase in manufacturing cost due to adding a step of forming a partition wall can be suppressed.

In the blue partition wall 650B or the red partition wall 650R, also materials other than the color material may be the same material as the blue color filter 618B or the red color filter 618R; for example, the matrix may be in common with the blue color filter 618B or the red color filter 618R. Further, the content ratio of the color material to the matrix in these partition walls may be made to substantially coincide with that of the respective color filters, or the content ratio may be made different from that of the respective color filters; for example, the content ratio may be set higher than that of the respective color filters.

At the boundary 660 at which the blue partition wall 650B or the red partition wall 650R is formed, these partition walls are formed with a certain width; therefore, the areas of formation of the color filters formed on both sides across the partition wall formed at the boundary 660 are eaten away by an amount equal to the width and are formed narrow.

Also at other boundaries 660, a partition wall may be formed to adjust the area of formation of the other color filter to a substantially equal size to the red color filter 618R or the blue color filter 618B, as a matter of course.

By forming the partition wall 650 such as the blue partition wall 650B or the red partition wall 650R described above, while the increase in manufacturing cost is suppressed, crosstalk between color filters and the resulting variation in sensitivity between pixels can be prevented. This measure is effective particularly in a place where the image height is high in the angle of view because crosstalk is likely to occur in this place.

(E) Fifth Embodiment

Figure 18:
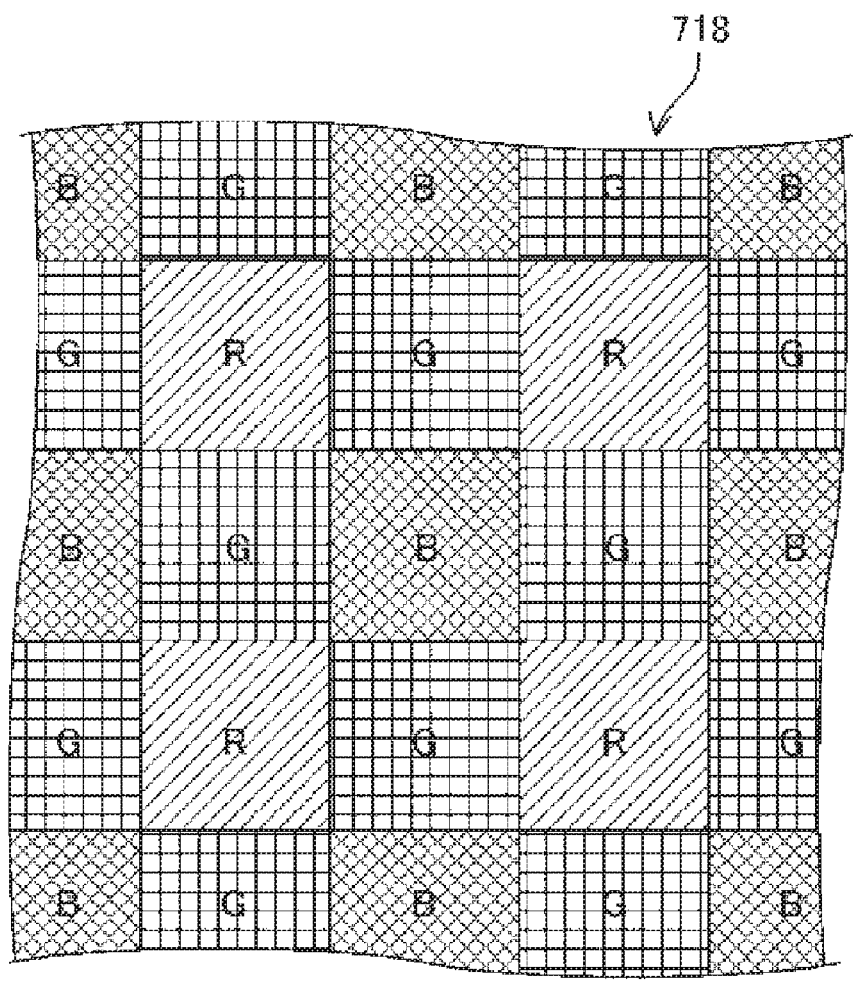
FIG. 18 is a diagram describing configurations of a solid state imaging device according to a fifth embodiment.

FIG. 18 is a diagram describing the configuration of a solid state imaging device 712 according to the embodiment. The drawing shows the positional relationship between the color filter and the partition wall in a planar view of a color filter layer 718 of the solid state imaging device 712. In the drawing, 718R, 718G, and 718B are written simply as "R," "G," and "B." Except for the color filter, the structure of the solid state imaging device 712 according to the embodiment is similar to the solid state imaging device 12 according to the first embodiment described above, and a detailed description is omitted.

In the color filter layer 718 according to the embodiment, the pixel arrangement is what is called the "Bayer" array. Specifically, what is called a checkered arrangement in which the green color filter 718G is placed in every other pixel (repeatedly in every two pixels) in both the vertical direction and the horizontal direction is employed, and the red color filter 718R and the blue color filter 718B are placed in a line sequential manner in the vertical direction and in every other pixel (repeatedly in every two pixels) in the horizontal direction.

[Partition Wall]

Figure 19:
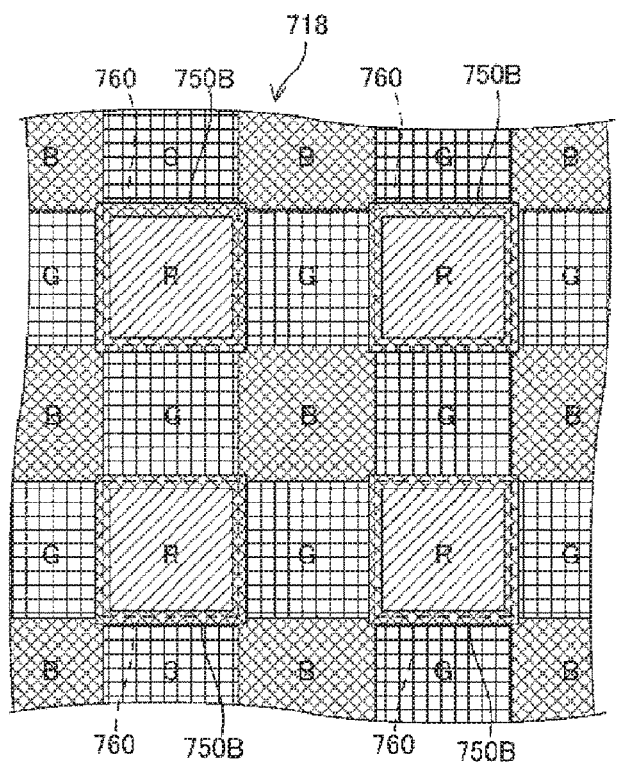
FIGS. 19(a), 19(b) are diagrams describing configurations of a solid state imaging device according to the fifth embodiment.
Figure 19:
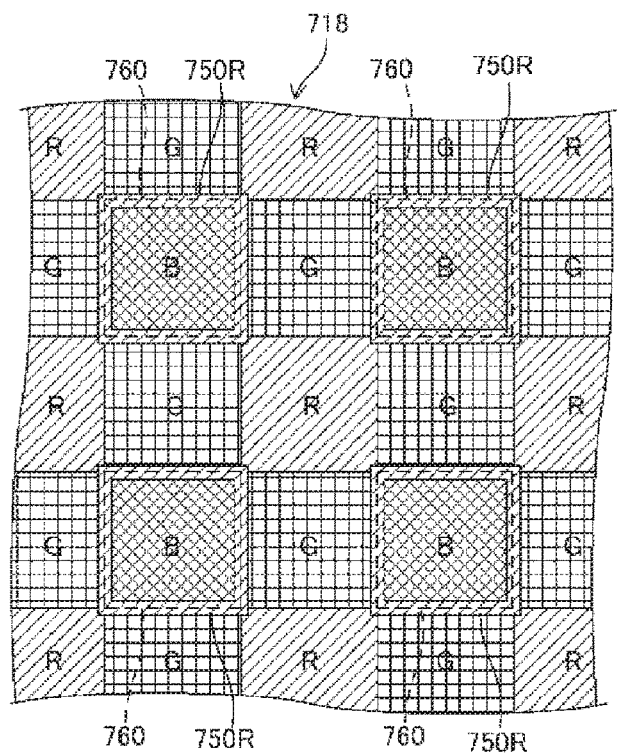

In the example shown in FIG. 19(*a*), along the boundary 760 extending along between the red color filter 718R and the green color filter 718G provided adjacent to this, a partition wall containing a color material of the same color as a color filter that is not adjacent across the boundary 760, namely, a blue partition wall 750B containing a color material of the same color as the blue color filter 718B is formed. More specifically, a blue partition wall 750B containing the same color material as the blue color filter 718B is formed along the boundary 760.

By thus providing the blue partition wall 750B along the boundary 760 around the red color filter 718R, crosstalk between the red color filter 718R and the green color filter 718G is avoided (in the case of the blue partition wall, particularly crosstalk with light of longer wavelengths than 550 nm). Furthermore, by forming the blue partition wall 750B using the same color material as the blue color filter 718B, the increase in manufacturing cost due to adding a step of forming a partition wall can be suppressed.

On the other hand, in the example shown in FIG. 19(*b*), along the boundary 760 extending along between the blue color filter 718B and the green color filter 718G provided adjacent to this, a partition wall containing the same color material as a color filter that is not adjacent across the boundary 760, namely, a red partition wall 750R containing the same color material as the red color filter 718R is formed. More specifically, a red partition wall 750R containing the same color material as the red color filter 718R is formed along the boundary 760.

By thus providing the red partition wall 750R along the boundary 760 around the blue color filter 718B, crosstalk between the blue color filter 718B and the green color filter 718G is avoided (in the case of the red partition wall, particularly crosstalk with light of shorter wavelengths than 550 nm). Furthermore, by forming the red partition wall 750R using the same color material as the red color filter 718R, the increase in manufacturing cost due to adding a step of forming a partition wall can be suppressed.

In the blue partition wall 750B or the red partition wall 750R, also materials other than the color material may be the same material as the blue color filter 718B or the red color filter 718R; for example, the matrix may be in common with the blue color filter 718B or the red color filter 718R. Further, the content ratio of the color material to the matrix in these partition walls may be made to substantially coincide with that of the respective color filters, or the content ratio may be made different from that of the respective color filters; for example, the content ratio may be set higher than that of the respective color filters.

At the boundary 760 at which the blue partition wall 750B or the red partition wall 750R is formed, these partition walls are formed with a certain width; therefore, the areas of formation of the color filters formed on both sides across the partition wall formed at the boundary 760 are eaten away by an amount equal to the width and are formed narrow.

Also at other boundaries 760, a partition wall may be formed to adjust the area of formation of the other color filter to a substantially equal size to the red color filter 718R or the blue color filter 718B, as a matter of course.

By forming the partition wall 750 such as the blue partition wall 750B or the red partition wall 750R described above, while the increase in manufacturing cost is suppressed, crosstalk between color filters and the resulting variation in sensitivity between pixels can be prevented. This measure is effective particularly in a place where the image height is high in the angle of view because crosstalk is likely to occur in this place. Furthermore, in a place where the image height is high in the angle of view, it becomes less likely that a difference will occur between the output of a green pixel provided between blue pixels and the output of a green pixel formed between red pixels.

The present technology is not limited to the embodiments or modification examples described above; and configurations in which the configurations disclosed in the embodiments and modification examples described above are replaced with each other or the combinations thereof are altered, configurations in which known technology and the configurations disclosed in the embodiments and modification examples described above are replaced with each other or the combinations thereof are altered, etc. are included in the present technology. Furthermore, the technical scope of the present technology is not limited to the embodiments described above, and includes the subject matter described in the claims and the equivalents thereof.

Additionally, the present technology may also be configured as below.

(1)

A solid state imaging device including:

a plurality of photoelectric conversion units configured to receive incident light on a light receiving surface and generate a signal charge;

color filters of at least three colors provided to correspond one-to-one to the plurality of photoelectric conversion units; and a partition wall formed between adjacent ones of the color filters so as to contain a color material of the same color as a color filter of a color different from colors of the adjacent color filters.

(2)

The solid state imaging device according to (1), wherein the color material contained in the partition wall is the same color material as the color filter of the different color.

(3)

The solid state imaging device according to (1) or (2), wherein a light blocking film is formed between the color filter and the photoelectric conversion unit so as to run along a boundary between ones of the plurality of photoelectric conversion units, and the partition wall is formed with a narrower width than the light blocking film in a direction orthogonal to the boundary.

(4)

The solid state imaging device according to any one of (1) to (3), wherein the partition wall is formed so as to surround each of the color filters of at least one color.

(5)

The solid state imaging device according to any one of (1) to (4), wherein the color filters are configured to include at least a green color filter, a white color filter, and a color filter of a color different from green and white, and the partition wall is formed along a boundary between the green color filter and the white color filter so as to contain a color material of the different color.

(6)

The solid state imaging device according to any one of (1) to (4), wherein the color filters are configured to include at least green color filters and a color filter of a color different from green, and the partition wall is formed along a boundary between ones of the green color filters provided adjacently so as to contain a color material of the different color.

(7)

The solid state imaging device according to any one of (1) to (4) or (6), wherein the color filters are configured to include at least a green color filter, and a first color filter and a second color filter of colors that are different from green and different from each other, and the partition wall is formed along a boundary between the green color filter and the first color filter so as to contain a color material of the same color as the first color filter.

(8)

The solid state imaging device according to any one of (1) to (4), wherein the color filters are configured to include at least a red color filter, a green color filter, and a blue color filter, and the partition wall is formed along a boundary between the green color filter and the blue color filter so as to contain a red color material.

(9)

The solid state imaging device according to any one of (1) to (4) or (8), wherein the color filters are configured to include at least a red color filter, a green color filter, and a blue color filter, and the partition wall is formed along a boundary between the green color filter and the red color filter so as to contain a blue color material.

(10)

An electronic apparatus including:

a solid state imaging device;

an optical system configured to guide incident light to the solid state imaging device; and a signal processing circuit configured to process an output signal of the solid state imaging device, wherein the solid state imaging device includes a plurality of photoelectric conversion units configured to receive incident light on a light receiving surface and generate a signal charge, color filters of at least three colors provided to correspond one-to-one to the plurality of photoelectric conversion units, and a partition wall formed between adjacent ones of the color filters so as to contain a color material of the same color as a color filter of a color different from colors of the adjacent color filters.

(11)

A method for manufacturing a solid state imaging device, including:

a first step of, in a semiconductor substrate, forming photoelectric conversion units configured to receive incident light on a light receiving surface and generate a signal charge;

a second step of, above the light receiving surfaces of the photoelectric conversion units, providing color filters of at least three colors configured to color the incident light and transmit the colored incident light to the light receiving surface, in correspondence with the plurality of photoelectric conversion units; and a third step of, between ones of the color filters provided adjacently, forming a partition wall containing a color material of the same color as a color filter of a color different from colors of the color filters provided adjacently.

(12)

The method for manufacturing a solid state imaging device according to (11), wherein the third step for forming the partition wall is performed as the same step as a step of forming, out of the color filters of the three colors, a color filter containing a color material of the same color as the partition wall.

REFERENCE SIGNS LIST 12 solid state imaging device
200 semiconductor substrate
200A substrate front surface
200B substrate back surface
210 pixel region
211 unit pixel
212 gate electrode
213 element isolation region
214 interconnection
215 interlayer insulating film
216 multilayer interconnection layer
217 planarizing film
218 color filter layer
218B blue color filter
218G green color filter
218R red color filter
219 microlens
220 light blocking film
221 interlayer insulating film 250 partition wall
250B blue partition wall
250R red partition wall
260 boundary
412 solid state imaging device
418 color filter layer
418B blue color filter
418G green color filter
418R red color filter
450B blue partition wall
450R red partition wall
460 boundary
512 solid state imaging device
518 color filter layer
518B blue color filter
518G green color filter
518R red color filter
550B blue partition wall
550R red partition wall
560 boundary
612 solid state imaging device
618 color filter layer
618BR>A blue color filter
618R red color filter
650B blue partition wall
650R red partition wall
660 boundary
712 solid state imaging device
718 color filter layer
718B blue color filter
718G green color filter
718R red color filter
750B blue partition wall
750R red partition wall
760 boundary
B1 boundary
B2 boundary
CF1 first color filter
CF2 second color filter
CFn adjacent color filter
CFt target color filter
JS light receiving surface
L1 first on-chip lens
L2 second on-chip lens
PD photodiode
PL planarizing film
PD1 first photodiode
PD2 second photodiode
Px1 first pixel
Px2 second pixel
S light blocking film
Su upper surface
W partition wall
Wb bottom surface

The invention claimed is:

1. A solid state imaging device, comprising:
a plurality of photoelectric conversion units configured to:
receive incident light on a light receiving surface; and
generate a signal charge based on the incident light;
a plurality of color filters of at least three colors, wherein each color filter of the plurality of color filters is associated with a corresponding photoelectric conversion unit of the plurality of photoelectric conversion units,
wherein the plurality of color filters comprises a first color filter of a first color, a second color filter of a second color, and a third color filter of a third color or a fourth color, wherein the fourth color is different from the first color, the second color, and the third color;
a partition wall that is between the first color filter and the second color filter,
wherein the first color filter is adjacent to the second color filter,
wherein the partition wall contains a first color material of same color as the third color of the third color filter, and
wherein the third color is different from the first color, the second color, and the fourth color; and
a light blocking film,
wherein the light blocking film stretches on a single surface of an insulating film,
wherein the light blocking film is on a boundary that is between any two adjacent photoelectric conversion units of the plurality of photoelectric conversion units, and
wherein the insulating film is above the plurality of photoelectric conversion units.

2. The solid state imaging device according to claim 1, wherein the first color material contained in the partition wall is same color as the fourth color of the third color filter.

3. The solid state imaging device according to claim 1, wherein the light blocking film is between one of the first color filter, the second color filter, or the third color filter and the corresponding photoelectric conversion unit of the plurality of photoelectric conversion units,
wherein a first width of the partition wall is narrower than a second width of the light blocking film in a first direction, and
wherein the first direction is orthogonal to the boundary, in a cross-sectional view of the solid state imaging device.

4. The solid state imaging device according to claim 1, wherein the first color of the first color filter or the second color of the second color filter is one of a green color or a white color,
wherein the first color of the first color filter is different from the second color of the second color filter,
wherein the fourth color of the third color filter is different from the green color and the white color,
wherein the partition wall is along a boundary between the first color filter and the second color filter, and
wherein the first color material of the partition wall is different from the green color and the white color.

5. The solid state imaging device according to claim 1, wherein one of the first color of the first color filter or the second color of the second color filter is a green color,
wherein the fourth color of the third color filter is different from the green color,
wherein the partition wall is along a boundary between the adjacent first color filter and the second color filter, and
wherein the first color material of the partition wall is same as the fourth color that is different from the green color.

6. The solid state imaging device according to claim 1, wherein the plurality of color filters further comprises at least a green color filter of a green color, a fourth color filter of a fifth color, and a fifth color filter of a sixth color,
wherein the fifth color of the fourth color filter and the sixth color of the fifth color filter are different from the green color,
wherein the fifth color is different from the sixth color, wherein the partition wall is along a boundary between the green color filter and the fourth color filter, and wherein the first color material of the partition wall is same color as the sixth color of the fifth color filter.

7. The solid state imaging device according to claim 1, wherein the plurality of color filters further comprises at least a red color filter, a green color filter, and a blue color filter, wherein the partition wall is along a boundary between the green color filter and the blue color filter, and wherein the first color material of the partition wall is a red color material.

8. The solid state imaging device according to claim 1, wherein the plurality of color filters further comprises at least a red color filter, a green color filter, and a blue color filter, wherein the partition wall is along a boundary between the green color filter and the red color filter, and wherein the first color material of the partition wall is a blue color material.

9. The solid state imaging device according to claim 1, wherein the plurality of color filters further comprise a plurality of first color filters, a plurality of second color filters, and a plurality of third color filters, wherein a first number of the plurality of first color filters is larger than one of a second number of the plurality of second color filters or a third number of the plurality of second color filters.

10. An electronic apparatus, comprising:

a solid state imaging device;

an optical system configured to guide incident light to the solid state imaging device; and a signal processing circuit configured to process an output signal of the solid state imaging device, wherein the output signal is generated by the solid state imaging device based on the incident light, and wherein the solid state imaging device includes:
  a plurality of photoelectric conversion units configured to:
    receive the incident light on a light receiving surface; and
    generate a signal charge based on the incident light;
  a plurality of color filters of at least three colors, wherein each color filter of the plurality of color filters is associated with a corresponding photoelectric conversion unit of the plurality of photoelectric conversion units,
  wherein the plurality of color filters comprises a first color filter of a first color, a second color filter of a second color, and a third color filter of a third color;
  a partition wall that is between the first color filter and the second color filter,
  wherein the first color filter is adjacent to the second color filter,
  wherein the partition wall contains a first color material of same color as the third color of the third color filter, and
  wherein the third color is different from the first color and the second color; and
  a light blocking film, wherein the light blocking film stretches on a single surface of an insulating film and the light blocking film is between any two adjacent photoelectric conversion units of the plurality of photoelectric conversion units, and
  wherein the insulating film is above the plurality of photoelectric conversion units.

11. A method for manufacturing a solid state imaging device, the method comprising:

forming a plurality of photoelectric conversion units, wherein the plurality of photoelectric conversion units are configured to:
  receive incident light on a light receiving surface; and
  generate a signal charge based on the received incident light;

forming a plurality of color filters of at least three colors on the light receiving surface of the plurality of photoelectric conversion units, wherein the plurality of color filters are configured to:
  color the incident light; and
  transmit the colored incident light to the light receiving surface, and wherein the plurality of color filters comprises a first color filter of a first color, a second color filter of a second color, and a third color filter of a third color;

forming a partition wall between the first color filter and the second color filter, wherein the first color filter is adjacent to the second color filter, wherein the partition wall containing a first color material is of same color as the third color of the third color filter, and wherein the third color is different from the first color and the second color;

forming an insulating film above the plurality of photoelectric conversion units; and forming a light blocking film stretching on a single surface of the insulating film, wherein the light blocking film is between any two adjacent photoelectric conversion units of the plurality of photoelectric conversion units.

12. The method for manufacturing a solid state imaging device according to claim 11, wherein the partition wall and the third color filter, containing a third color material of same color as the first color material of the partition wall, are formed concurrently.

* * * * *